US012784178B2

(12) United States Patent
Korb et al.

(10) Patent No.: US 12,784,178 B2
(45) Date of Patent: Nov. 3, 2026

(54) METHOD FOR DEFECT DETECTION IN A SEMICONDUCTOR SAMPLE IN SAMPLE IMAGES WITH DISTORTION

(71) Applicant: Carl Zeiss MultiSEM GmbH, Oberkochen (DE)

(72) Inventors: Thomas Korb, Schwäbisch Gmünd (DE); Jens Timo Neumann, Aalen (DE); Ulrich Hofmann, Munich (DE); Sven Meyer, Rauenberg (DE); Thomas C. Chust, Munich (DE)

(73) Assignee: Carl Zeiss MultiSEM GmbH, Oberkochen (DE)

( * ) Notice: Subject to any disclaimer, the term of this patent is extended or adjusted under 35 U.S.C. 154(b) by 273 days.

(21) Appl. No.: 18/406,448

(22) Filed: Jan. 8, 2024

(65) Prior Publication Data

US 2024/0242334 A1 Jul. 18, 2024

Related U.S. Application Data

(63) Continuation of application No. PCT/EP2022/025344, filed on Jul. 25, 2022.

(30) Foreign Application Priority Data

Jul. 30, 2021 (DE) ..................... 10 2021 119 008.8

(51) Int. Cl.
*G06T 7/00* (2017.01)
*G06T 7/33* (2017.01)
*H01J 37/22* (2006.01)

(52) U.S. Cl.
CPC .............. *G06T 7/001* (2013.01); *G06T 7/337* (2017.01); *H01J 37/222* (2013.01);
(Continued)

(58) Field of Classification Search
CPC ..................... G06T 7/001; G06T 7/337; G06T 2207/20021; G06T 2207/30148; H01J 37/222; H01J 2237/22
(Continued)

(56) References Cited

U.S. PATENT DOCUMENTS 4,130,761 A 12/1978 Matsuda
4,153,843 A 5/1979 Pease
(Continued)

FOREIGN PATENT DOCUMENTS

DE 10 2013 014 976 A1 3/2015
DE 10 2013 016 113 A1 3/2015
(Continued)

OTHER PUBLICATIONS

NPL: IP.com and IEEE, Results Publication Date Range: Dec. 26, 1991 to Nov. 28, 2025.*
(Continued)

*Primary Examiner* — Quang N Vo
(74) *Attorney, Agent, or Firm* — Fish & Richardson P.C.

(57) ABSTRACT

A method for defect detection in a sample, such as in a semiconductor sample, includes the following steps: providing a reference image of the sample; providing a sample image generated via a particle beam inspection system, wherein the sample image comprises a rotation with respect to the reference image; dividing the sample image into sample image regions; dividing the reference image into reference image regions, wherein each sample image region is assigned one reference image region to form an image region pair; identifying in each image region pair a structure that is present both in the sample image region and also in the associated reference image region of the image region pair; registering the sample image regions by correcting a lateral offset of the identified structure in each sample image
(Continued)

region on the basis of the location of the identified structure in the respectively associated reference image region, as a result of which corrected sample image regions are formed; and comparing each corrected sample image region pixel by pixel with the respectively associated reference image region for defect detection.

27 Claims, 7 Drawing Sheets

(52) U.S. Cl.
CPC ............... *G06T 2207/20021* (2013.01); *G06T 2207/30148* (2013.01); *H01J 2237/221* (2013.01)

(58) Field of Classification Search
USPC .......................................................... 382/149
See application file for complete search history.

(56) References Cited

U.S. PATENT DOCUMENTS

| | | | |
|---|---|---|---|
| 4,200,794 | A | 4/1980 | Newberry |
| 4,338,548 | A | 7/1982 | Bono |
| 4,742,234 | A | 5/1988 | Feldman |
| 5,215,623 | A | 6/1993 | Takahashi |
| 5,777,392 | A | 7/1998 | Fujii |
| 5,864,142 | A | 1/1999 | Muraki |
| 5,892,224 | A | 4/1999 | Nakasuji |
| 5,905,267 | A | 5/1999 | Muraki |
| 5,981,954 | A | 11/1999 | Muraki |
| 6,107,636 | A | 8/2000 | Muraki |
| 6,124,599 | A | 9/2000 | Muraki |
| 6,137,113 | A | 10/2000 | Muraki |
| 6,323,499 | B1 | 11/2001 | Muraki |
| 6,333,508 | B1 | 12/2001 | Katsap |
| 6,580,505 | B1 | 6/2003 | Bareket |
| 6,617,595 | B1 | 9/2003 | Okunuki |
| 6,633,366 | B2 | 10/2003 | De Jager |
| 6,696,371 | B2 | 2/2004 | Butschke |
| 6,787,780 | B2 | 9/2004 | Hamaguchi |
| 6,804,288 | B2 | 10/2004 | Haraguchi |
| 6,818,911 | B2 | 11/2004 | Tamamori |
| 6,835,508 | B2 | 12/2004 | Butschke |
| 6,872,950 | B2 | 3/2005 | Shimada |
| 6,903,345 | B2 | 6/2005 | Ono |
| 6,903,353 | B2 | 6/2005 | Muraki |
| 6,917,045 | B2 | 7/2005 | Hashimoto |
| 6,919,574 | B2 | 7/2005 | Hashimoto |
| 6,921,916 | B2 | 7/2005 | Adel et al. |
| 6,943,349 | B2 | 9/2005 | Adamec |
| 6,953,938 | B2 | 10/2005 | Iwasaki |
| 6,992,290 | B2 | 1/2006 | Watanabe |
| 7,005,658 | B2 | 2/2006 | Muraki |
| 7,015,467 | B2 | 3/2006 | Maldonado |
| 7,060,984 | B2 | 6/2006 | Nagae |
| 7,084,411 | B2 | 8/2006 | Lammer-Pachlinger |
| 7,091,504 | B2 | 8/2006 | Wieland |
| 7,109,494 | B2 | 9/2006 | Ono |
| 7,126,141 | B2 | 10/2006 | Ono |
| 7,129,502 | B2 | 10/2006 | Kruit |
| 7,244,949 | B2 | 7/2007 | Knippelmeyer et al. |
| 7,285,779 | B2 | 10/2007 | Litman |
| 7,375,326 | B2 | 5/2008 | Sender |
| 7,420,164 | B2 | 9/2008 | Nakasuji |
| 7,468,507 | B2 | 12/2008 | Rogers |
| 7,504,622 | B2 | 3/2009 | Elyasaf |
| 7,535,001 | B2 | 5/2009 | Sender |
| 7,601,972 | B2 | 10/2009 | Nakasuji |
| 7,619,203 | B2 | 11/2009 | Elyasaf |
| 7,696,497 | B2 | 4/2010 | Rogers |
| 8,035,082 | B2 | 10/2011 | Yamazaki |
| 8,134,135 | B2 | 3/2012 | Kruit |
| 8,350,214 | B2 | 1/2013 | Otaki |
| 8,362,425 | B2 | 1/2013 | Han |
| 8,384,051 | B2 | 2/2013 | Ozawa |
| 8,598,525 | B2 | 12/2013 | Zeidler |
| 8,618,496 | B2 | 12/2013 | Wieland |
| 8,704,192 | B2 | 4/2014 | Sano |
| 8,748,842 | B2 | 6/2014 | Ohashi |
| 8,779,399 | B2 | 7/2014 | Yamanaka |
| 8,829,465 | B2 | 9/2014 | Tsunoda |
| 8,963,099 | B2 | 2/2015 | Yamada |
| 9,153,413 | B2 | 10/2015 | Almogy |
| 9,263,233 | B2 | 2/2016 | Zeidler |
| 9,336,981 | B2 | 5/2016 | Knippelmeyer |
| 9,336,982 | B2 | 5/2016 | Zeidler |
| 9,349,571 | B2 | 5/2016 | Kemen |
| 9,368,314 | B2 | 6/2016 | Nakasuji |
| 9,530,613 | B2 | 12/2016 | Rogers |
| 9,536,702 | B2 | 1/2017 | Lang |
| 9,607,805 | B2 | 3/2017 | Liu |
| 9,653,254 | B2 | 5/2017 | Zeidler |
| 9,702,983 | B2 | 7/2017 | Eder |
| 9,922,799 | B2 | 3/2018 | Li |
| 9,991,089 | B2 | 6/2018 | Mueller |
| 10,062,541 | B2 | 8/2018 | Ren |
| 10,141,160 | B2 | 11/2018 | Ren |
| 10,354,831 | B2 | 7/2019 | Kemen |
| 10,388,487 | B2 | 8/2019 | Zeidler |
| 10,535,494 | B2 | 1/2020 | Zeidler |
| 10,541,112 | B2 | 1/2020 | Schubert |
| 10,586,677 | B1 | 3/2020 | Okada |
| 10,600,613 | B2 | 3/2020 | Zeidler |
| 10,622,184 | B2 | 4/2020 | Knippelmeyer |
| 10,643,820 | B2 | 5/2020 | Ren |
| 10,741,355 | B1 | 8/2020 | Zeidler |
| 10,811,215 | B2 | 10/2020 | Zeidler |
| 10,854,423 | B2 | 12/2020 | Sarov |
| 10,879,031 | B2 | 12/2020 | Ren |
| 10,896,800 | B2 | 1/2021 | Riedesel |
| 2009/0014649 | A1 | 1/2009 | Nakasuji |
| 2014/0151570 | A1 | 6/2014 | Kato et al. |
| 2014/0197325 | A1 | 7/2014 | Kato |
| 2016/0125583 | A1 | 5/2016 | Amanullah et al. |
| 2017/0133198 | A1 | 5/2017 | Kruit |
| 2019/0114758 | A1 | 4/2019 | Vajaria et al. |
| 2019/0122913 | A1 * | 4/2019 | Lauber .................. G03F 7/7065 |
| 2019/0333732 | A1 | 10/2019 | Ren |
| 2019/0355544 | A1 | 11/2019 | Riedesel et al. |
| 2020/0211810 | A1 | 7/2020 | Zeidler |
| 2020/0243300 | A1 | 7/2020 | Zeidler |
| 2020/0373116 | A1 | 11/2020 | Zeidler |
| 2021/0005423 | A1 | 1/2021 | Zeidler |
| 2021/0035773 | A1 | 2/2021 | Zeidler |
| 2021/0192700 | A1 | 6/2021 | Zeidler et al. |
| 2021/0210303 | A1 | 7/2021 | Zeidler et al. |
| 2021/0210306 | A1 | 7/2021 | Zeidler et al. |
| 2021/0217577 | A1 | 7/2021 | Zeidler et al. |
| 2022/0102104 | A1 | 3/2022 | Fritz et al. |
| 2023/0043036 | A1 | 2/2023 | Zeidler et al. |

FOREIGN PATENT DOCUMENTS

| | | | |
|---|---|---|---|
| DE | 10 2021 119 008 | A1 | 2/2023 |
| GB | 2519511 | A | 4/2015 |
| GB | 2521819 | A | 7/2015 |
| JP | 59184524 | A | 10/1984 |
| JP | 60042825 | A | 3/1985 |
| JP | 60105229 | A | 6/1985 |
| JP | 61263217 | A | 11/1986 |
| JP | 2014229481 | A | 12/2014 |
| TW | 201802465 | A | 1/2018 |
| WO | WO 2005/024881 | A2 | 3/2005 |
| WO | WO 2007/028595 | A2 | 3/2007 |
| WO | WO 2007/028596 | A1 | 3/2007 |
| WO | WO 2007/060017 | A2 | 5/2007 |
| WO | WO2013032949 | A1 | 3/2013 |
| WO | WO2020057678 | A1 | 3/2020 |
| WO | WO2020064035 | A1 | 4/2020 |
| WO | WO2020065094 | A1 | 4/2020 |
| WO | WO2020070074 | A1 | 4/2020 |
| WO | WO2020151904 | A2 | 7/2020 |

(56) References Cited

FOREIGN PATENT DOCUMENTS

| | | | | | |
|---|---|---|---|---|---|
| WO | WO2020249147 | A1 | | 12/2020 | |
| WO | WO 2021/078352 | A1 | | 4/2021 | |
| WO | WO-2022242984 | A1 | * | 11/2022 | ............... G06T 5/20 |

OTHER PUBLICATIONS

NPL: InnovationQ+ by IP.com and IEEE, Results Publication Date Range: Dec. 26, 1991 to Apr. 28, 2026.*

International Search Report and Written Opinion for corresponding PCT Appl No. PCT/EP2022/025344, dated Jan. 3, 2023.

Taiwanese Office Action and Search Report, with translation, for corresponding TW Appl No. 111127685, dated Jun. 2, 2023.

J. Lotz et al., *Patch-based nonlinear image registration for gigapixel whole slide image*, IEEE Transactions on Biomedical Engineering (2016), 63, Jg.Nr.9 p. 1812-1819.

R. Nakagaki et al., *Automatic recognition of defect areas a a semiconductor wafer using multiple scanning electron microscope images*, Measurement Science and Technology (2009), 20. Jg, Nr. 7, p. 075503.

A.L. Eberle et al., High-resolution, high-throughput imaging with a multibeam scanning electron microscope:high throughput imaging with a multibeam SEM, Journal of Microscopy, vol. 259, No. 2, (2015), p. 114-120.

Taiwanese Office Action and Search Report, with translation, for corresponding TW Appl No. 111127685, dated Dec. 29, 2023.

Office Action in Korean Appln. No. 10-2024-7006482, mailed on Mar. 29, 2026, 17 pages (with English translation).

* cited by examiner

METHOD FOR DEFECT DETECTION IN A SEMICONDUCTOR SAMPLE IN SAMPLE IMAGES WITH DISTORTION

CROSS-REFERENCE TO RELATED APPLICATIONS

The present application is a continuation of, and claims benefit under 35 USC 120 to, international application PCT/EP2022/025344, filed Jul. 25, 2022, which claims benefit under 35 USC 119 of German Application No. 10 2021 119 008.8, filed Jul. 30, 2021. The entire disclosure of each these applications is incorporated by reference herein.

FIELD

The disclosure relates to a method for defect detection in a sample, such as in a semiconductor sample, wherein sample images are generated via a particle beam inspection system. The particle beam inspection system can be for example a multiple particle beam inspection system.

BACKGROUND

With the continuous development of ever smaller and ever more complex microstructures such as semiconductor components, there can be a desire to develop and optimize planar production techniques and inspection systems for producing and inspecting small dimensions of the microstructures. By way of example, the development and production of the semiconductor components can involve monitoring of the design of test wafers, and the planar production techniques can involve process optimization for a reliable production with a high throughput. Moreover, there have been recent demands for an analysis of semiconductor wafers for reverse engineering and for a customer-specific, individual configuration of semiconductor components. Therefore, it can be desirable to have an inspection mechanism which can be used with a high throughput for examining the microstructures on wafers with great accuracy.

Typical silicon wafers used in the production of semiconductor components have diameters of up to 300 mm. Each wafer is divided into 30 to 60 repeating regions ("dies") with a size of up to 800 mm$^2$. A semiconductor apparatus comprises a plurality of semiconductor structures, which are produced in layers on a surface of the wafer by planar integration techniques. Semiconductor wafers typically have a plane surface on account of the production processes. The structure sizes of the integrated semiconductor structures in this case extend from a few μm to the critical dimensions (CD) of 5 nm, with the structure sizes becoming even smaller in the near future; in the future, structure sizes or critical dimensions (CD) are expected to be less than 3 nm, for example 2 nm, or even under 1 nm. In the case of the aforementioned small structure sizes, defects in the size of the critical dimensions are to be identified quickly in a very large area. For several applications, the specification regarding the accuracy of a measurement provided by inspection equipment is even higher, for example by a factor of two or one order of magnitude. By way of example, a width of a semiconductor feature are measured with an accuracy of below 1 nm, for example 0.3 nm or even less, and a relative position of semiconductor structures are determined with an overlay accuracy of below 1 nm, for example 0.3 nm or even less.

The MSEM, a multi-beam scanning electron microscope, is a relatively new development in the field of charged particle systems (charged particle microscopes, CPMs). By way of example, a multi-beam scanning electron microscope is disclosed in U.S. Pat. No. 7,244,949 B2 and in US 2019/0355544 A1. In the case of a multi-beam electron microscope or MSEM, a sample is irradiated simultaneously with a plurality of individual electron beams, which are arranged in a field or raster. By way of example, 4 to 10,000 individual electron beams can be provided as primary radiation, with each individual electron beam being separated from an adjacent individual electron beam by a pitch of 1 to 200 micrometres. By way of example, an MSEM has approximately 100 separate individual electron beams ("beamlets"), which are arranged for example in a hexagonal raster, with the individual electron beams being separated by a pitch of approximately 10 μm. The plurality of charged individual particle beams (primary beams) are focused on a surface of a sample to be examined by way of a common objective lens. By way of example, the sample can be a semiconductor wafer which is fastened to a wafer holder that is mounted on a movable stage. During the illumination of the wafer surface with the charged primary individual particle beams, interaction products, for example secondary electrons or backscattered electrons, emanate from the surface of the wafer. Their start points correspond to those locations on the sample on which the plurality of primary individual particle beams are focused in each case. The amount and the energy of the interaction products generally depend on the material composition and the topography of the wafer surface. The interaction products form a plurality of secondary individual particle beams (secondary beams), which are collected by the common objective lens and which are incident on a detector arranged in a detection plane as a result of a projection imaging system of the multi-beam inspection system. The detector comprises a plurality of detection regions, each of which comprises a plurality of detection pixels, and the detector captures an intensity distribution for each of the secondary individual particle beams. An image field of for example 100 μm×100 μm is obtained in the process.

Certain known multi-beam electron microscopes comprise a sequence of electrostatic and magnetic elements. At least some of the electrostatic and magnetic elements are settable in order to adapt the focus position and the stigmation of the plurality of individual charged particle beams. Certain known multi-beam system with charged particles moreover comprise at least one cross-over plane of the primary or the secondary individual charged particle beams. Moreover, such systems comprise detection systems to make the setting easier. Certain known multi-beam particle microscopes comprise at least one beam deflector ("deflection scanner") for collective scanning of a region of the sample surface via the plurality of primary individual particle beams in order to obtain an image field of the sample surface. Further details regarding a multi-beam electron microscope and a method for operating same are described in the German patent application with the application Ser. No. 10/202,0206739.2, filed on May 28, 2020, the disclosure of which is incorporated in full in this patent application by reference.

To detect defects in a semiconductor sample, images of the sample obtained via a scanning electron microscope or via other particle beam inspection systems, such as for example the MSEM described above, can be used. Two conventional methods are based here on a comparison of a sample image with a reference image. This reference image can be a reference image that was likewise recorded via the charged particle beam inspection system ("die-to-die comparison", D2D). However, it is also possible to directly compare a sample image with the desired target design, wherein an emulated image can be generated for example on the basis of design data ("die-to-database comparison", D2DB). In both approaches, the images to be compared are compared pixel by pixel with one another. If there are deviations between the structures in the sample image compared with the reference image that are too great, these deviations are detected as defects.

This type of defect detection can involve distortions of structures in the sample images. If distortions occur, structures in the sample images are changed, for example offset and/or rotated compared to the structures in the reference image, and the deviations caused by the distortion in a pixel-based comparison between the sample image and the reference image can be marked as defects, although these deviations frequently do not constitute real defects. These undesired detections that mark what are not real defects are referred to as "false positives" or "nuisance". A reliable defect detection can become impossible due to these false-positive defects.

The distortions themselves can be affine distortions or non-linear distortions. One example of an affine distortion is a rotation of the sample image compared with the reference image. The causes of such a rotation may differ. A first possibility is, for example, that the sample is not aligned exactly ("misalignment") with respect to the particle beam inspection system. It is here possible to place a sample on a sample holder only with a limited accuracy. Another cause for the occurrence of a rotation can be the electron lenses: In magnetic lenses, charged particles undergo a rotation due to the Lorentz force. This rotation can be calibrated out with a corresponding calibration of the particle beam inspection system, but an image field rotation still occurs again regularly after a refocusing of the particle beam inspection system.

A further example of affine distortion in the sample image can be anisotropy of the pixel size, since the two scanning directions in a charged particle beam inspection system are normally independent of one another or can be set independently.

Non-linear distortions can occur for example due to non-linearities of the particle beam scan generator. Since this is a property of the particle beam inspection system, for example a scanning electron microscope, non-linearities can be reduced at least up to a certain point by way of a calibration. Another source of non-linear distortions are charges on the sample. These cannot be calibrated in general.

In the cases described, the distortions bring about differences between the sample image and the reference image and subsequently result in numerous undesired false-positive defect detections.

It is possible to gain an impression of the meaning of the distortion mentioned when considering a simple example: The rotation of structures in a sample image is observed, with this rotation being only 1 mrad compared to the reference image: Assuming an edge length of 10 μm of the sample image, this rotation results in a feature shift by 0.001 rad×10 000 nm=10 nm from the left corner to the right corner, with this shift already being of the same order of magnitude as the size of defects that are intended to be found. With a direct comparison of structures of the sample image with corresponding structures in a reference image, many false-positive defects are therefore determined during a pixel-based comparison using conventional methods.

NAKAGAKI, Ryo; HONDA, Toshifumi; NAKAMAE, Koji. Automatic recognition of defect areas on a semiconductor wafer using multiple scanning electron images. Measurement Science and Technology, 2009, 20, p. 075503 discloses a method for defect detection with a scanning electron microscope which applies a single electron beam. To improve existing methods, the paper suggests providing additional detectors so that several different images with different advantages for recognizing different kinds of defects can be generated simultaneously during one scan. The paper furthermore discloses a local registration to cope with an image distortion that arises from electrostatic charge of the surface of the sample when the beam moves in a scanning motion. This type of distortion is a non-linear distortion. The paper does not disclose a defect detection in an image comprising an affine distortion such as a rotation of a sample image with respect to a reference image. Furthermore, since a normalized cross correlation coefficient is used for the local registration, the method of the paper may not be suited for a defect detection in images with an affine distortion such as a rotation.

SUMMARY

The present disclosure seeks to improve a method for defect detection in a sample and in particular in a semiconductor sample. The method for defect detection can provide reliable results in particular even if the sample image has a distortion and in particular if the sample image comprises a rotation with respect to a reference image. Furthermore, the method can be applicable to multi beam particle microscopes and their particular characteristics.

According to a first aspect, the disclosure provides a method for defect detection in a sample, such as in a semiconductor sample. The method includes the following steps: a) providing a reference image of the sample; b) providing a sample image generated via a particle beam inspection system, wherein the sample image comprises a rotation with respect to the reference image; c) dividing the sample image into sample image regions; d) dividing the reference image into reference image regions, wherein each sample image region is assigned one reference image region to form an image region pair; e) identifying in each image region pair a structure that is present both in the sample image region and also in the associated reference image region of the image region pair; f) registering the sample image regions by correcting a lateral offset of the identified structure in each sample image region on the basis of the location of the identified structure in the respectively associated reference image region, as a result of which corrected sample image regions are formed; and g) comparing each corrected sample image region pixel by pixel with the respectively associated reference image region for defect detection.

According to the disclosure, a sample image can be generated via a particle beam inspection system. It is possible that the sample image is generated "on-the-fly" during the method for defect detection. However, it is also possible that the sample image was already generated prior to the method for defect detection. The particle beam inspection system can be for example any particle beam inspection system. It may be an individual particle beam system, for example an individual beam electron microscope (SEM) or a helium ion microscope (HIM). However, it is also possible that the particle beam inspection system is a multi-beam particle beam system, for example a multi-beam electron microscope (MSEM). In the context of the definitions of the present patent application, a sample image is in any case generated with an individual assigned charged particle beam. In line with the definition, the sample image is thus not an image that is composed of a plurality of individual images; such a composed image would correspond to a plurality of sample images.

According to the disclosure, the sample image can have distortions, for example the sample image comprises a rotation with respect to the reference image as a distortion. The method for defect detection in a sample provides good results even if the sample image has such distortions and for example even if the sample image comprises a rotation with respect to the reference image However, it is of course nevertheless possible to use the method for defect detection even in sample images that have no distortions. It is also frequently the case that it is not exactly known in advance whether distortions are present or what type of distortions they are. In this situation, the method for defect detection according to the disclosure can offer significant added value.

According to the disclosure, a reference image of the sample can be provided. This reference image can be an emulated image of the sample, which is based for example on specified design data of the sample, or of the semiconductor sample. However, it is also possible that the reference image is a further recording of a sample or of an identical or comparable sample that is or has been recorded with the same or another particle beam inspection system as the sample image provided.

According to the disclosure, the sample image can be divided into sample image regions (patches). Optionally, all sample image regions have the same dimensions. For example, they can be rectangular or square, but parallelogram shapes or other shapes are also possible. The use of sample image regions having identical dimensions can simplify the subsequent registration method.

According to the disclosure, the reference image can also be divided into reference image regions, wherein each sample image region is assigned one reference image region to form an image region pair. The dimensions of the reference image and of the sample image here match or are correspondingly scaled such that a match exists. The dimensions of a sample image region and of an associated reference image region can be identical in each case, which can allow a best possible assignment to image region pairs to be achieved.

According to the disclosure, in each image region pair a structure that is present both in the sample image region and also in the associated reference image region of the image region pair can be identified. This structure serves as a starting structure for the subsequent registration. The structure is an easy-to-recognize structure which should be capable of being identified without any doubt in each of the image regions. How such a structure is to be selected and identified is sufficiently known. For example, U.S. Pat. No. 6,921,916 B2, U.S. Pat. No. 6,580,505 B1 and U.S. Pat. No. 5,777,392 A disclose fundamental details relating to registration methods and marker structures.

According to the disclosure, registering the sample image regions can be effected by correcting a lateral offset of the identified structure in each sample image region on the basis of the location of the identified structure in the respectively associated reference image region, as a result of which corrected sample image regions are formed. A lateral offset of the identified structure can be corrected. Since the sample image comprises a rotation with respect to the reference image as a distortion, the identified structures in each sample image region can also be rotated to a certain degree. However, here, this rotation is shift-corrected, only. In illustrative terms, each sample image region is thus shifted during the registration operation. Using a pure shifting operation, the identified structures in each image region pair are made to substantially coincide with one another. Rather than a common/single-step registration of the entire sample image, the disclosure can make provision for a registration of partial regions, specifically of the sample image regions. Owing to the fact that only a lateral offset is corrected, conventional registration routines are capable of performing the registration. Owing to the fact that one registration per sample image region is carried out, distortions in the sample image during registration have only an insignificant effect, if any at all. While in the case of a distortion in the entire sample image there exist significant deviations from the entire reference image so that the complete sample image cannot be made to coincide with the reference image with respect to the structures imaged therein by way of shifting operations, this is successful when registering the smaller sample image regions.

If the pixel-based comparison of each corrected sample image region with the respectively assigned reference image region for defect detection takes place, this pixel-based comparison can yield practically no false-positive defects during the defect detection, or the occurrence thereof will be significantly reduced in any case. This effect can become clear upon closer examination of the geometric situations and size relationships of structures in the sample image regions when distortions occur in the sample image:

According to an embodiment of the disclosure, a distortion of the sample image is small, and, for the associated shift $|\vec{\Delta}(\vec{r})|$:

$$|\vec{\Delta}(\vec{r})|/\min(w_x, w_y) \ll 1 \tag{1}$$

In this case, $\vec{r}$ denotes a position in the field of view $w_x \times w_y$ and $\vec{\Delta}$ denotes the associated shift. If this equation is satisfied, the structures in the sample image are still situated in the vicinity of their expected positions. In this case, an initial registration of the individual sample image regions with respect to the assigned reference image regions will succeed. By way of example, a field of view (FOV) of an individual beam scanning electron microscope with 10 μm shall be considered. A rotation of the structures located therein by 1 mrad shifts the structures located therein from their expected position (expected position in the reference image) by no more than 10 nm.

According to an embodiment of the disclosure, the structures of the dimension CD, which are to be examined with respect to defects, in the sample image are small and the following applies:

$$\sqrt{(\partial_x \Delta_x)^2 + (\partial_x \Delta_y)^2} \ll 1 \tag{2a}$$

inside a window with the dimension $CD_x$ and $$\sqrt{(\partial_y \Delta_x)^2 + (\partial_y \Delta_y)^2} \ll 1 \tag{2b}$$

inside a window with the dimension $CD_y$.

As a result, the conditions (2a), (2b) mean that the distortion does not vary too greatly from location to location. A structure thus practically does not change its shape due to the distortion (a bar does not become a serpentine and vice versa). The two conditions (1) and (2a) or (2b) mentioned above are normally satisfied anyway in existing semiconductor defect detection methods. For example, let a structure have a spatial extent of 50 nm and experience a rotation by 1 mrad due to a distortion. This structure then experiences a local distortion which is no greater than 0.05 nm, which in turn lies below the typical resolution limit of a particle beam inspection system. Typical shifts that can occur for structures lie in the order of magnitude of approximately 10 nm. Changes in the shape of the structures that frequently occur lie in a range of less than 1 nm, for example are approximately 0.1 nm, which lies below the resolution limit of a typical particle beam inspection system.

The conditions (2a), (2b) that a structure to be examined with respect to defects in the sample image is small should also be considered to have been met if the structure to be examined is meaningfully decomposable into a plurality of correspondingly small parts.

According to an embodiment of the disclosure, the respective lateral offset of the respectively identified structure is corrected in two directions which are linearly independent with respect to one another, such as in two mutually orthogonal directions. For example, a lateral offset is corrected in the x-direction and in the y-direction, with x and y being orthogonal to one another. This can have computational advantages. However, it is also possible to provide a different coordinate system or reference system (for example a parallelogram).

The above general considerations also can lead to desired properties regarding a preferred size or dimension of the sample image regions. A sample image region is large enough so that structures therein that are capable of registration can still be detected at all. In addition, a sample image region is large enough so that, despite a relative shift between the sample image region and the assigned reference image region, a common image region content with mutually corresponding identifiable structures is still present. Calculations on the part of the inventors show that these desired properties regarding the edge length of the sample image regions $A_{PB}$ are satisfied if:

$$A_{PB} \geq 5 \max_{\vec{r} \in Bild\_PB} |\vec{\Delta}(\vec{r})| \tag{3}$$

The size or dimension of a sample image region should thus be at least five times the size of a maximally occurring distortion. This can apply to each direction in which the lateral offset is corrected, in other words for example in a Cartesian coordinate system in the direction x and direction y. The size of a maximally occurring distortion can here be estimated or calculated, and in particular it is dependent on the type of the distortion that occurs. On this basis, the dimension of the sample image regions can be determined according to equation (3).

In other words, a sample image region is desirably not be too small. On the other hand, a sample image region is desirably not be too large either—otherwise the above-described issues in a one-step registration of the entire sample image according to the prior art occur. Calculations on part of the inventors have shown that it can be desirable if a location-dependent distortion does not change more significantly over a sample image region than approximately half the defect size which is sought as part of the defect detection. Otherwise, the result of the distortion could be that the sample image region and the assigned reference image region cannot be made to coincide with one another by registration, but that, in the difference image region between the sample image region and the assigned reference image region, there will always be a signal of more than half a defect size which would then be incorrectly interpreted as a false-positive defect. Mathematically, this gives the following estimate:

$$A_{PB} \leq A_{Def} * \left( \frac{1}{|grad|\vec{\Delta}||} \right) \tag{4}$$

Here, $A_{Def}$ denotes the defect size and $|grad|\vec{\Delta}||$ denotes the absolute value of the gradient of the location-dependent distortion or shift. This absolute value of the gradient may be imagined illustratively according to an example as a shift of the corners of a sample image region with respect to one another (compression or extension of the corner-to-corner distance due to the distortion). The corner-to-corner distance may not change due to the distortion by more than approximately half the defect size.

If rotations occur as the distortion, a maximum size of the sample image regions $A_{PB}$ is particularly small. Consequently, a decomposition of the sample image into particularly small sample image regions is desirable. On the other hand, it is desirable to perform successful registration with as few decompositions as possible. It is therefore optional that (detectable) rotations are detected and corrected prior to the defect detection according to the disclosure (also) via another method. In that case, the sample image regions can be selected to be larger, and the rotations which would otherwise not be detectable can be corrected.

According to an embodiment of the disclosure, a size of the sample image regions is selected, when dividing the sample image, such that a shape of the sample image regions does not substantially change due to the distortion. The size of the sample image regions thus additionally is selected to be small enough for the described condition to be satisfied. A typical size for a sample image region is here approximately 1 to 5 μm, such as 1 to 3 μm, for example 2 μm.

According to an embodiment of the disclosure, the sample image regions are quadrangular, such as rectangular or square, and the distances between the corners of the sample image regions are shifted relative to one another with respect to the distances between the corners of the associated reference image regions relative to one another due to the distortion in the sample image by no more than a predetermined number of pixels.

According to an embodiment of the disclosure, distances between the corners of the sample image regions are shifted relative to one another with respect to the associated distances between the corners of the reference image regions relative to one another due to the distortion by no more than half an expected defect size.

According to an embodiment of the disclosure, mutually adjacent sample image regions have an overlap, wherein the respective overlap is selected to be at least as large as the size of an expected defect. The overlap between adjacent sample image regions can be in any case selected to be the same size. However, it is also possible for the overlap to be selected to be different, for example to select a differently sized overlap in the x-direction and y-direction. If the set overlap is selected to be at least as large as the size of an expected defect, any such defect is imaged entirely in at least one sample image region. When counting defects, care may have to be taken to avoid counting the same defect twice.

According to an embodiment of the disclosure, the sample image has, in addition to the rotation, another affine distortion with respect to the reference image, and/or the sample image has a non-linear distortion with respect to the reference image. An affine distortion involves that points and straight lines of the space are mapped to points and straight lines while maintaining collinearity. The division ratio of any three points on any straight line is maintained (preservation of division ratio) and each pair of parallel straight lines is mapped to a pair of parallel straight lines (preservation of parallelism). Examples of an affine distortion are rotations (for example due to misalignments in the sample placement or to image field rotation of charged particle beams) and the aforementioned anisotropy in the pixel size. Examples of a non-linear distortion are distortions due to non-linearities in the beam generation and due to sample charging. It is possible that different effects overlay one another in the distortion, in other words that a distortion overall is the result of a plurality of incorrect imagings/distortions. Defect detection can in general be successfully applied with the aid of the method according to the disclosure to all types of distortions. However, special emphasis is to be given to the successful application of the method if a distortion in the form of a rotation is present, because, for one part, this type occurs particularly frequently and, for the other, existing registration methods frequently fail in the case of this type of distortion. It can be desirable to correct rotations as far as possible even before the method according to the disclosure is carried out. The remaining correction of the rotation is then taken care of as part of the method according to the disclosure with its specific strengths.

According to an embodiment of the disclosure, the method furthermore includes the following step: determining a distortion function or a distortion pattern for the sample image on the basis of the corrected lateral offset of the sample image regions during registration. Optionally, a distortion function or a distortion pattern is determined on the basis of the corrected lateral offset of all sample image regions. In general, the more data have been used to determine the distortion function or the distortion pattern, the more precise is the determination of the function or of the pattern. It is possible for example to examine the available data with respect to the corrected lateral offset for the distortion pattern rotation. It is possible here to hypothetically assume a rotation as the distortion, and it is possible to determine whether, at a specific rotation angle, the corrected sample image regions are in fact offset corresponding to the expectation/preview. A rotation angle that is as exact as possible can then be determined iteratively. Therefore, the method can comprise determining a rotation angle of the sample image with respect to the reference image.

According to an embodiment of the disclosure, the method furthermore includes the following step: adjusting and/or calibrating the particle beam inspection system on the basis of the distortion function and/or the distortion pattern. It is thus possible to reduce or entirely prevent the distortion in further recordings via the particle beam inspection system.

According to an embodiment of the disclosure, the method furthermore includes the following step: coarsely registering the sample image with respect to the reference image. This coarse registration is performed here before the actual fine registration or the registration according to the disclosure as part of the method for defect detection according to the disclosure. For coarse registration, the well-known registration methods from the prior art can be used alone or in combination. After a coarse registration, the sample image and the associated reference image can lie on top of one another at least sufficiently well so that, as part of the method according to the disclosure, the sample image regions produced by the division and their associated reference image regions are not completely disjunct, but have structures that at least partially really correspond to one another. If the latter is not possible for all sample image regions, the condition should be satisfied at least for as many sample image regions as possible. Pre-registration can be very important such as in a D2D method, since it is not ensured in a D2D method that the same is actually seen in images from two different measurements, for example because inaccuracies in the range of approximately 0.5 μm to 1 μm may certainly occur due to positioning errors of the sample stage. To this extent, and as far as possible, a pre-registration should also involve pre-correcting the rotations in the sample image, which have already been mentioned multiple times, with respect to the reference image.

According to an embodiment of the disclosure, the particle beam inspection system is an individual particle beam system, in particular an individual beam electron microscope (SEM) or a helium ion microscope (HIM). However, it could also be another individual particle beam system.

According to an embodiment of the disclosure, the particle beam inspection system is a multiple particle beam system, in particular a multi-beam electron microscope (MSEM), operating with a plurality of individual particle beams. However, it is also possible to use a different multiple particle beam system with different charged particles as particle beam inspection system.

According to an embodiment of the disclosure, the described method is performed for a plurality of sample images, wherein each sample image is generated via an individual particle beam associated therewith. A multi-image is here composed of a plurality of individual images (sample images). In general, the described method can be performed here for each sample image.

There are multiple particle beam systems that operate with a plurality of columns. That means that individual particle beams are guided through an individual particle optical unit for the individual particle beam. In general, distortions of an individual type can occur within each of the columns. For example, it is possible that an image field rotation of an individual particle beam occurs within each column. This effect per column can also be overlaid by a general rotation, which is caused for example by a misalignment of the sample to be examined on the sample holder. The method according to the disclosure works in the case of such distortions.

There are also multi-beam particle beam systems that operate with a single column. According to an embodiment, the multiple particle beam system comprises a single column for the plurality of individual particle beams. Here, the plurality of individual particle beams travel through the same particle optical unit (wherein it is not ruled out that individual particle beams are nevertheless individually influenced at some points in the particle-optical beam path; however, frequently there are magnetic lenses through which all individual particle beams travel together, for example an objective lens, a condenser lens and/or a field lens or corresponding systems). If each individual particle beam is assigned a sample image (single field of view, sFOV), wherein the sample images are composed to form an overall sample image (multi-field of view, mFOV), the situation for a distortion in single-column systems is different than in multi-column systems: As they pass through only one column, the individual particle beams in their entirety undergo an image field rotation, the individual sample images are thus not additionally rotated with respect to one another. Image field rotation and a rotation due to inaccurate positioning of a sample with respect to the sample holder can in this case add up. In general, the described method for defect detection can here also be carried out for each sample image individually.

In order to still further improve the method for defect detection overall even when using multiple particle beam systems, according to an embodiment, the method is carried out for the plurality of sample images in a shell-wise manner. A shell-wise process proceeds from a base sample image. This sample image can be located centrally within the plurality of the sample images, but it is also possible that it is located laterally offset with respect thereto or, for example, near a peripheral region. If a centrally arranged sample image is used as the starting point, a plurality of complete shells around the central sample image can be defined by other sample images arranged around the central, or base, sample image. If the base sample image is not centrally arranged, the shells are possibly not complete, but the term shell-wise is still used in connection with the disclosure. The registration of the sample images as such is still carried out for each sample image in a sample image region-wise manner and with shift correction within the sample image regions, only. Furthermore, the defect detection as such is carried out pixel by pixel by comparing the corrected sample image regions with the respectively associated reference image regions. However, the order according to which the registration and defect detection is carried out for the plurality of sample images is of importance and this order is shell-wise. Before a defect detection is carried out in a new/more outer shell, an additional correction of positions of sample images within that shell can be carried out. For example, the centre positions of the sample images can be positionally corrected and/or an overall orientation of the sample images can be corrected. Then, in the registration step before the pixel-by-pixel defect detection step as such, only lateral offsets of identified structures are corrected. The shell-wise process contributes to reducing errors occurring due to error propagation in particular in the presence of rotations as distortions. The more sample images (sFOVs) are present in a multi-image (mFOV), the more important this error reduction becomes.

According to an embodiment of the disclosure, the sample images are arranged hexagonally with respect to one another and/or the sample images have an overlap with adjacent sample images. Via a hexagonal arrangement of the individual sample images, overall hexagonal multi-sample images are formed, which in turn can be placed with further multi-sample images one next to the other in the manner of tiles (tessellation). Therefore, a multiple particle beam system can operate with $3n(n-1)+1$ individual particle beams, with n denoting a natural number. However, it is also possible that the sample images are arranged differently with respect to one another, for example in the manner of a chequerboard. The overlap between different sample images makes it easier to stitch together the sample images to form a multi-sample image.

According to an embodiment of the disclosure, the method furthermore includes the following steps: selecting a sample image as base sample image; carrying out the method steps a) to g) for defect detection for the base sample image; selecting first sample images that are arranged in a first shell around the base sample image; and carrying out the method steps a) to g) for defect detection for the first sample images.

The base sample image selected can be a sample image in which an easy-to-identify structure is shown. In each case, a base sample image should be registered securely because the further registration and later also the defect detection build up from this registration of the base sample image. Once the base sample image is correctly registered, and with the described prerequisites (distortion of the sample image is small and structures to be examined with respect to defects in the sample image are small), registration of the first sample images and defect detection in the corrected (registered) sample images of the first shell around the base sample image takes place. If the sample images are arranged hexagonally with respect to one another, the first (complete) shell around the base sample image comprises six further sample images. The sample images are here registered, as has already been described further above, sample image region by sample image region, by correcting a lateral offset of the structure identified in each sample image region, and corrected sample image regions are formed for all sample image regions. The detailed statements above apply accordingly.

According to an embodiment of the disclosure, the method furthermore includes the following step: determining a first angle of rotation for the distortion based on the sample image region-wise registration of the first individual sample images of the first shell. The determined first angle of rotation here describes a rotation as a distortion in a first approximation.

According to an embodiment of the disclosure, the method includes the following steps: selecting second sample images that are arranged in a second shell around the base sample image; correcting a position of the second sample images based on the determined first angle of rotation; and carrying out the method steps a) to g) for defect detection for the position-corrected second sample images.

The second shell can again be a closed shell or merely a partial shell. If the sample images are arranged in a hexagonal arrangement, a complete second shell has 12 second sample images. The second sample images are registered on the basis of the determined first angle of rotation. In this case, it is extrapolated, for example, in what way/to what extent the second sample images shift if it is also true for the second sample images of the second shell that they are rotated by the first angle of rotation. The reference to the determined first angle of rotation thus ensures simplified starting conditions in the registration, in which—as is the case in general—sample image regions are registered sample image region-wise by correcting a lateral offset of identified structures.

According to an embodiment of the disclosure, the method furthermore includes the following step: determining a second angle of rotation for the distortion based on the sample image region-wise registration of the second sample images of the second shell.

With this determination of the second angle of rotation, the existing value of the first angle of rotation is improved. First, significantly more second sample images are arranged in the second shell around the base sample image than in the first shell around the base sample image. The data basis for determining the second angle of rotation is thus improved.

Second, as the distance from the centre of rotation increases, the accuracy with which an angle of rotation can be determined increases.

According to an embodiment of the disclosure, the method furthermore includes the following steps: selecting third sample images that are arranged in a third shell around the base sample image; correcting a position of the third sample images based on the determined second angle of rotation; and carrying out the method steps a) to g) of defect 10) detection for the position-corrected third individual sample images.

The third shell can again be a complete shell or a partial shell. If the individual sample images are arranged hexagonally with respect to one another (tessellation), a complete third shell has 18 individual sample images. The third individual sample images are then registered based on the determined second angle of rotation. Here, too, the second angle of rotation determined in the previous method step is used to provide better starting conditions for the defect detection/registration process for the registration of the third individual sample images in the third shell. In addition, it is possible, based on the registration of the third individual sample images of the third shell, to determine a third angle of rotation for the distortion. In the manner described, the method can be carried out for a further shell or for further shells, wherein these shells can again be complete shells or merely partial shells. The method described is thus iterative with respect to the determination of the angle of rotation, and with each iteration the angle of rotation typically becomes determinable with greater accuracy. The further to the outside the registration of the sample images moves starting from the base sample image, the more important it also becomes to take into account the determined angle of rotation as part of the registration: Without previously taking the angle of rotation determined in the prior method step into account, the higher the likelihood that registration of the sample images in farther away situated shells fails. A situation would arise in which, without taking the angle of rotation into consideration, a search would take place for a registration in regions of the reference image of the sample that only has a few regions or does not have any regions in common with the actually associated regions/regions of interest of the sample image. For the reason described, the shell-wise registration of the sample images makes an important contribution to a method for defect detection in a sample in the case of distortions in sample images obtained via a multiple particle beam inspection system.

According to a further aspect of the disclosure, the latter relates to a computer program product having a program code for carrying out the method, as has been described above in various embodiment variants and examples. In this case, the program code can be divided into one or more partial codes. The code can be written in any desired programming language.

The described embodiments of the disclosure can be combined with one another in full or in part, provided that no technical contradictions arise as a result.

BRIEF DESCRIPTION OF THE DRAWINGS

The disclosure will be understood even better with reference to the accompanying figures, in which.

DETAILED DESCRIPTION

Figure 1:
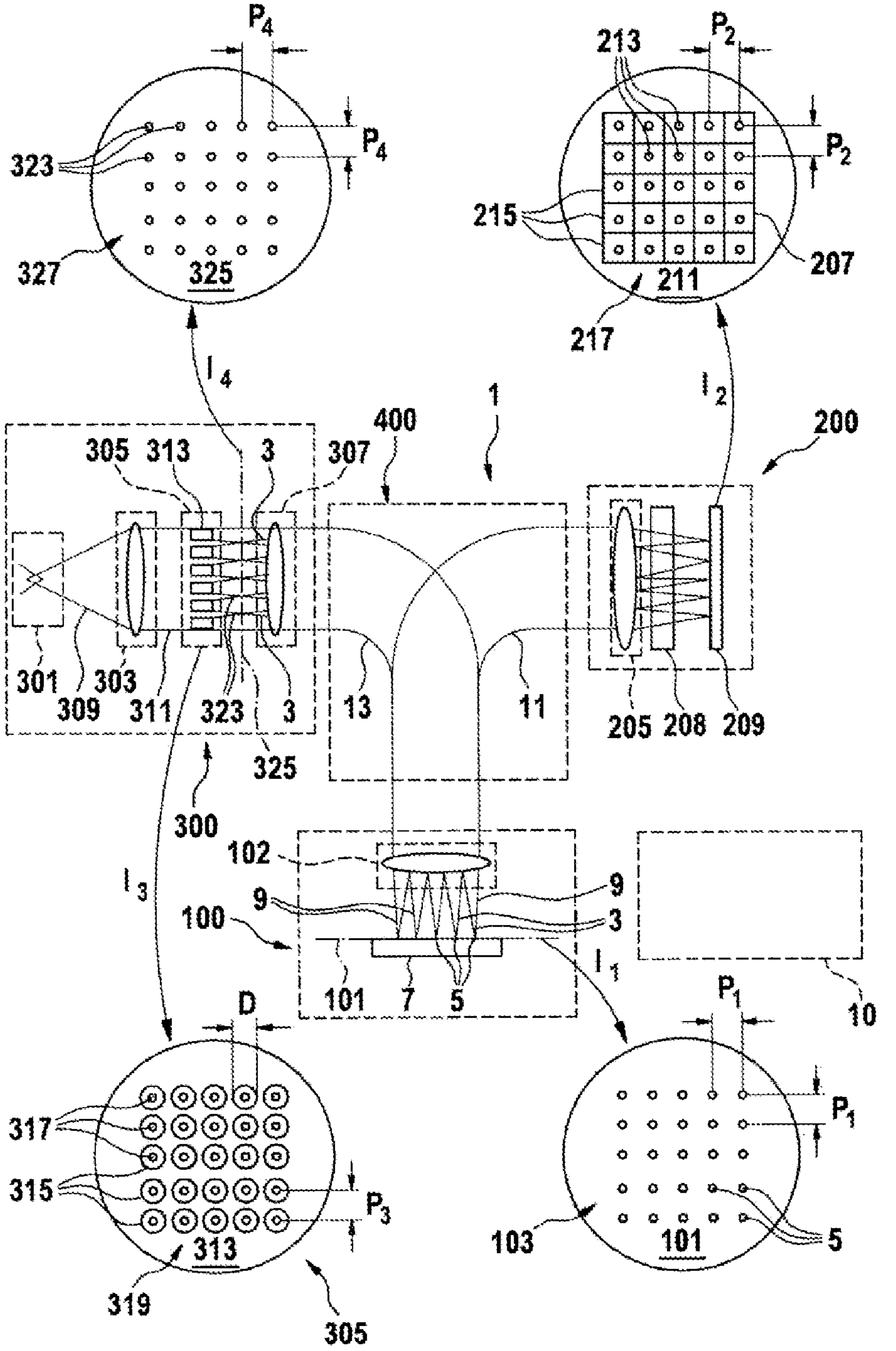
FIG. 1: shows a schematic illustration of a multi-beam particle microscope (MSEM)

FIG. 1 is a schematic illustration of a particle beam system 1 in the form of a multi-beam particle microscope 1, which uses a plurality of particle beams. The particle beam system 1 generates a plurality of particle beams which are incident on an object to be examined in order to generate there interaction products, e.g. secondary electrons, which emanate from the object and are subsequently detected. The particle beam system 1 is of the scanning electron microscope (SEM) type, which uses a plurality of primary particle beams 3 which are incident on a surface of the object 7 at a plurality of locations 5 and produce there a plurality of electron beam spots, or spots, that are spatially separated from one another. The object 7 to be examined can be of any desired type, e.g. a semiconductor wafer or a biological sample, and comprise an arrangement of miniaturized elements or the like. The surface of the object 7 is arranged in a first plane 101 (object plane) of an objective lens 102 of an objective lens system 100.

The enlarged detail I1 in FIG. 1 shows a plan view of the object plane 101 having a regular rectangular field 103 of incidence locations 5 formed in the first plane 101. In FIG. 1, the number of incidence locations is 25, which form a 5×5 field 103. The number 25 of incidence locations is a number chosen for reasons of simplified illustration. In practice, the number of beams, and hence the number of incidence locations, can be chosen to be significantly greater, such as, for example, 20×30, 100×100 and the like.

In the depicted embodiment, the field 103 of incidence locations 5 is a substantially regular rectangular field having a constant spacing P1 between adjacent incidence locations. Exemplary values of the spacing P1 are 1 micrometer, 10 micrometres and 40 micrometres. However, it is also possible for the field 103 to have other symmetries, such as a hexagonal symmetry, for example.

A diameter of the beam spots formed in the first plane 101 can be small. Exemplary values of the diameter are 1 nanometer, 5 nanometres, 10 nanometres, 100 nanometres and 200 nanometres. The focusing of the particle beams 3 for shaping the beam spots 5 is carried out by the objective lens system 100.

The primary particles incident on the object generate interaction products, e.g. secondary electrons, backscattered electrons or primary particles that have experienced a reversal of movement for other reasons and which emanate from the surface of the object 7 or from the first plane 101. The interaction products emanating from the surface of the object 7 are shaped by the objective lens 102 to form secondary particle beams 9. The particle beam system 1 provides a particle beam path 11 for guiding the plurality of secondary particle beams 9 to a detector system 200. The detector system 200 comprises a particle optical unit with a projection lens 205 for directing the secondary particle beams 9 at a particle multi-detector 209.

The detail 12 in FIG. 1 shows a plan view of the plane 211, in which individual detection regions of the particle multi-detector 209 on which the secondary particle beams 9 are incident at locations 213 are located. The incidence locations 213 lie in a field 217 with a regular spacing P2 from one another. Exemplary values of the spacing P2 are 10 micrometres, 100 micrometres and 200 micrometres.

The primary particle beams 3 are generated in a beam generating apparatus 300 comprising at least one particle source 301 (e.g. an electron source), at least one collimation lens 303, a multi-aperture arrangement 305 and a field lens 307. The particle source 301 produces a diverging particle beam 309, which is collimated or at least substantially collimated by the collimation lens 303 in order to shape a beam 311 which illuminates the multi-aperture arrangement 305.

The detail I3 in FIG. 1 shows a plan view of the multi-aperture arrangement 305. The multi-aperture arrangement 305 comprises a multi-aperture plate 313, which has a plurality of openings or apertures 315 formed therein. Midpoints 317 of the openings 315 are arranged in a field 319 that is imaged onto the field 103 formed by the beam spots 5 in the object plane 101. A spacing P3 between the midpoints 317 of the apertures 315 can have exemplary values of 5 micrometres, 100 micrometres and 200 micrometres. The diameters D of the apertures 315 are smaller than the distance P3 between the midpoints of the apertures. Exemplary values of the diameters D are 0.2×P3, 0.4×P3 and 0.8×P3.

Particles of the illuminating particle beam 311 pass through the apertures 315 and form particle beams 3. Particles of the illuminating beam 311 which are incident on the plate 313 are absorbed by the latter and do not contribute to the formation of the particle beams 3.

On account of an applied electrostatic field, the multi-aperture arrangement 305 focuses each of the particle beams 3 in such a way that beam foci 323 are formed in a plane 325. Alternatively, the beam foci 323 can be virtual. A diameter of the beam foci 323 can be, for example, 10 nanometres, 100 nanometres and 1 micrometer.

The field lens 307 and the objective lens 102 provide a first imaging particle optical unit for imaging the plane 325, in which the beam foci 323 are formed, onto the first plane 101 such that a field 103 of incidence locations 5 or beam spots arises there. Should a surface of the object 7 be arranged in the first plane, the beam spots are correspondingly formed on the object surface.

The objective lens 102 and the projection lens arrangement 205 provide a second imaging particle optical unit for imaging the first plane 101 onto the detection plane 211. The objective lens 102 is thus a lens that is part of both the first and the second particle optical unit, while the field lens 307 belongs only to the first particle optical unit and the projection lens 205 belongs only to the second particle optical unit.

A beam switch 400 is arranged in the beam path of the first particle optical unit between the multi-aperture arrangement 305 and the objective lens system 100. The beam switch 400 is also part of the second optical unit in the beam path between the objective lens system 100 and the detector system 200.

Further information relating to such multi-beam particle beam systems and components used therein, such as, for instance, particle sources, multi-aperture plate and lenses, can be obtained from the international patent applications WO 2005/024881 A2, WO 2007/028595 A2, WO 2007/028596 A1, WO 2011/124352 A1 and WO 2007/060017 A2 and the German patent applications DE 10 2013 016 113 A1 and DE 10 2013 014 976 A1, the disclosure of which is incorporated in full in the present application by reference.

The multiple particle beam system furthermore comprises a computer system 10, which is configured both for controlling the individual particle-optical components of the multiple particle beam system and for evaluating and analysing the signals obtained using the multi-detector 209. It can also be used to carry out the method according to the disclosure. In this case, the computer system 10 can be constructed from a plurality of individual computers or components.

Figure 2:
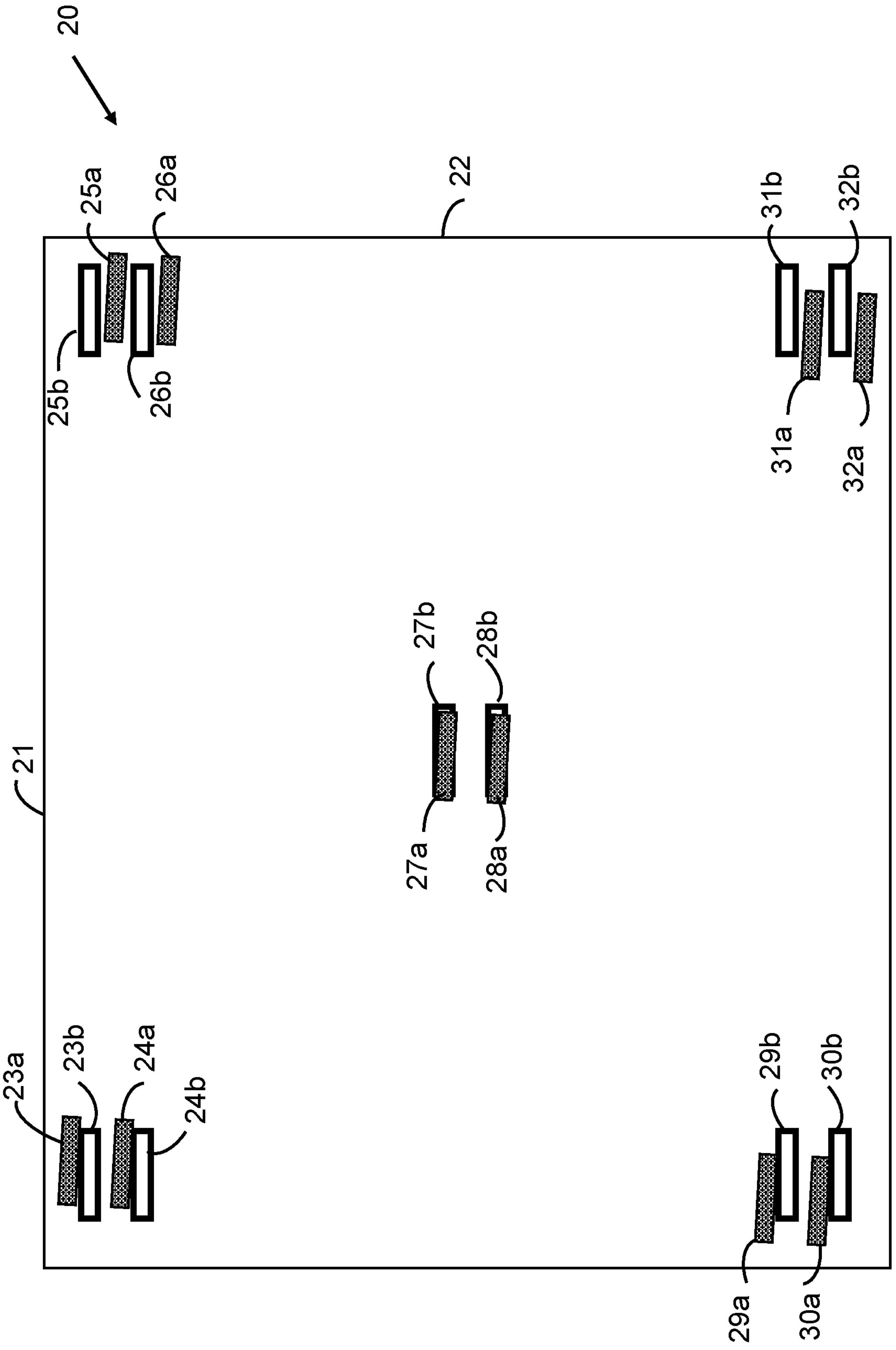
FIG. 2: schematically illustrates a distortion in a sample image compared with a reference image.

FIG. 2 schematically illustrates a distortion in a sample image 20 compared with a reference image. The sample image 20 has been generated using an individual particle beam, wherein this individual particle beam can be the only particle beam of an individual particle beam inspection system or an individual particle beam from a plurality of individual particle beams 3 of a multiple particle beam system. The sample image 20 corresponds to, for example, an individual image field (single field of view, sFOV) of an MSEM. In the example shown, the sample image 20 is rectangular and has a long side 21 and a slightly shorter side 22. Typical dimensions of a sample image 20 are approximately 10 μm (short side 22,) or 12 μm (long side 21). The dimensions of the sides 21, 22 can also be larger or smaller, however.

The sample image 20 comprises a plurality of structures 23*a* to 32*a*, which are illustrated here by way of example as elongate bars. Likewise shown in the sample image 20 are structures 23*b* to 32*b* of an associated reference image. The sample image 20 and the reference image that is assigned to the sample image 20 form an image pair. The structures 23*a* to 32*a* are provided in FIG. 2 with a pattern fill, while the structures 23*b* to 32*b* assigned to the reference image are shown merely as outlines. FIG. 2 shows that the respective structures 23*a* to 32*a* do not come to lie exactly on the reference structures 23*b* to 32*b*. In the central region of the sample image 20, the structures 27*a* and 27*b* and also 28*a* and 28*b* still lie on top of one another relatively well. However, in the region of the corners of the sample image 20, this is no longer the case at all: In the upper right corner, the structures 25*a* and 26*a* lie below and shifted to the right with respect to the reference structures 25*b* and 25*b*. In the bottom right corner of the sample image 20, the structures 31*a* and 32*a* are also shifted downwards, but in this case to the left. This also continues in the other corners of the sample image 20: The structures 29*a* and 30*a* in the bottom left corner are shifted upwards and to the left with respect to the reference structures 29*b* and 30*b*. The structures 23*a* and 24*a* in the upper left corner of the sample image 20 are shifted upwards and to the right with respect to the reference structures 23*b* and 24*b*.

When looking at the structures 23*a* to 32*a* in comparison with the reference structures 23*b* to 32*b* in FIG. 2, it is immediately obvious that the structures cannot be made to coincide with one another using a pure shift or pure shifts. Instead, the structures 23*a* to 32*a* exhibit a distortion of the sample image 20 with respect to the reference image. If a conventional method for defect detection were carried out for the sample image 20, the result would be a plurality of false-positive defects: A pixel-based comparison of the corrected sample image 20 with the reference image provides many false-positive signals for defects because the associated structures a,b simply do not lie on top of one another at all at many positions. It is irrelevant here whether the reference image is a specially selected, since successful, sample image or whether the reference image is an emulated image on the basis of design data of a sample. The latter is, for example, generally typical for the defect detection in semiconductor samples (D2DB defect detection).

Figure 3:
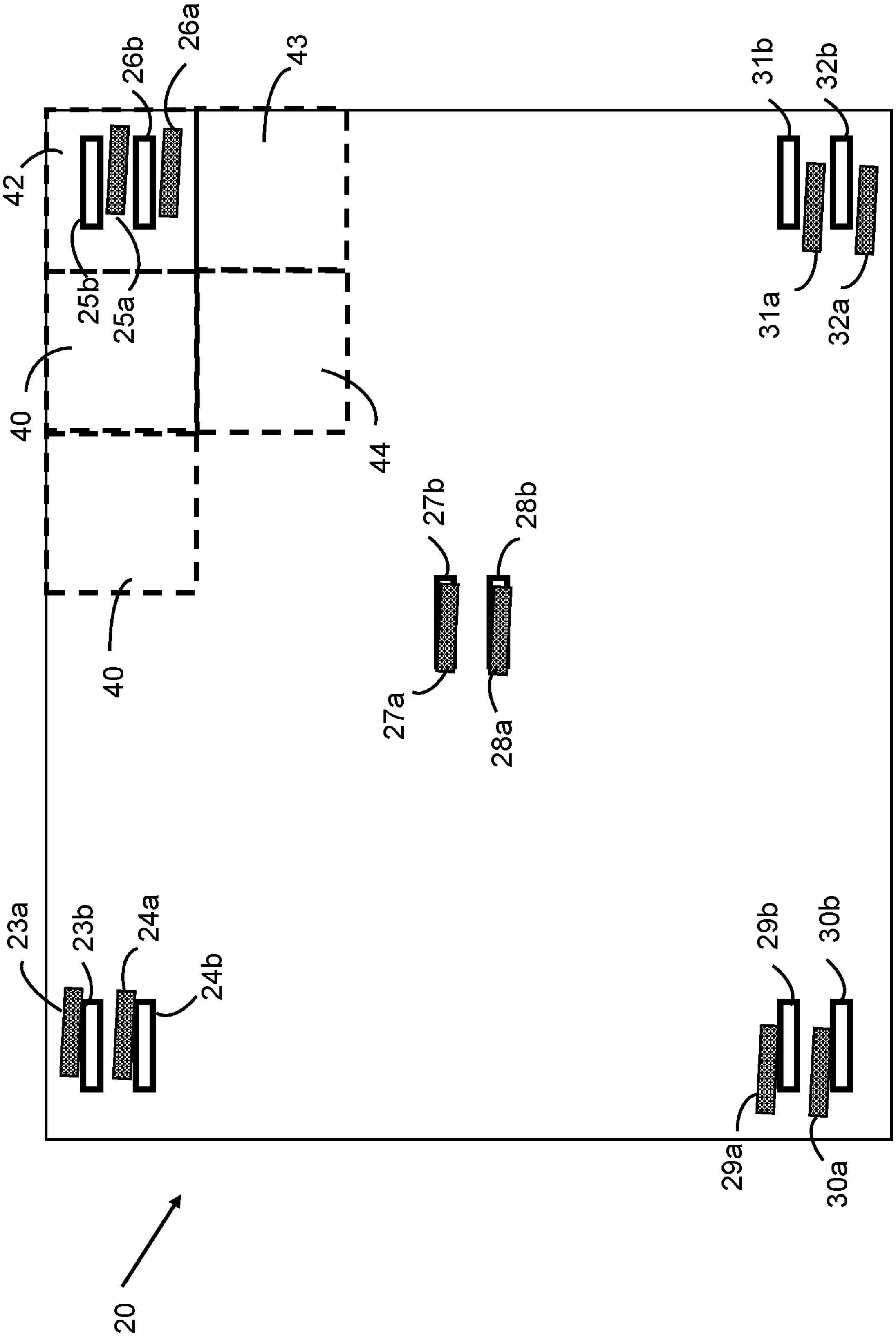
FIG. 3: schematically shows a division of a sample image into a plurality of sample image regions.

FIG. 3 now illustrates a basic concept of the present disclosure and schematically shows a division of a sample image 20 into a plurality of sample image regions 40 to 44. The sample image regions 40 to 44 are illustrated here only as examples, of course the entire sample image 20 is divided into a plurality of sample image regions (in other words, FIG. 3 does not show all the sample image regions). In the example shown, the sample image regions 40 to 44 or all the sample image regions have an identical size and identical dimensions. In the example shown, they are square and have, by way of example, an edge length of approximately 2 μm.

Figure 4B:
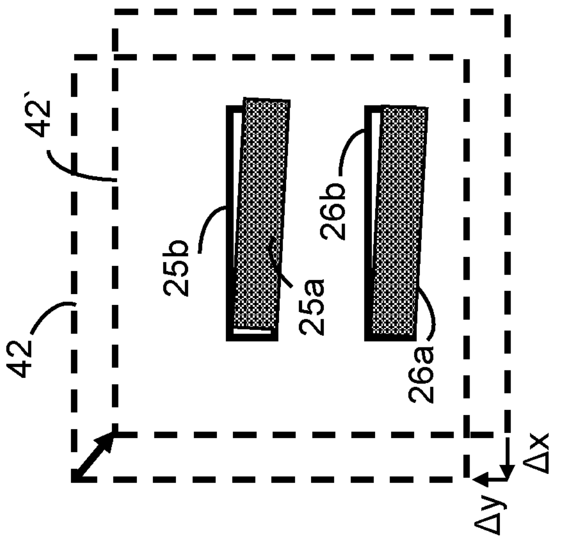
FIGS. 4A-4B: schematically show the result of a registration of sample image regions.
Figure 4A:
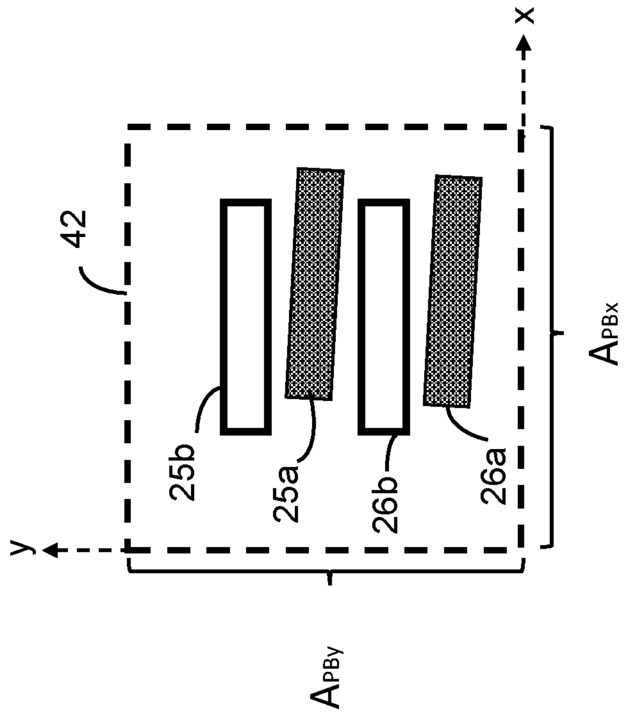

FIG. 4 now illustrates, by way of example for the sample image region 42, registration of the sample image region 42: Registration is performed according to the disclosure by correcting a lateral offset of the identified structure or structures 25*a* and 26*a* on the basis of the location of the identified structure or structures 25*b* and 26*b* in the respectively assigned reference image region, as a result of which a corrected sample image region 42' is formed. FIG. 4A shows the starting situation before the registration, FIG. 4B shows the situation after the sample-image-region-wise registration: The structures 25*a* and 26*a* can be made to substantially coincide with the assigned structures 25*b* and 26*b* of the reference image by way of a lateral offset Δx, Δy. The deviation in the position of the structures in the sample image region compared with the position in the reference image region is very small and may even be so small that the deviation lies below the measurement accuracy/resolution of the particle beam system. In the example shown, the lateral offset is made in two directions that are mutually linearly independent, in the present case in the direction of the x-axis and the y-axis, which are orthogonal to each other. The axes x and y are correspondingly drawn in FIG. 4A. FIG. 4B shows the lateral offset Δx and Δy.

The sample-image-region-wise registration makes it possible to significantly reduce or entirely prevent the number of false-positive defects during a defect detection which is pixel-based. If a pixel-based comparison of the corrected sample image region 42' with the associated reference image region is performed, the structures of the sample image region 25*a* and 26*a* lie so precisely on top of the structures 25*b* and 26*b* of the reference image region that the pixel-based defect detection does not provide a false positive defect.

It should be noted here that the position deviations are greatly exaggerated in the figures to illustrate the idea. The deviations can lie in particular below the detection limit or below the resolution of the particle beam inspection system.

In the example illustrated in FIG. 3, the sample image regions 40 to 44 do not overlap. However, it is possible that the sample image regions 40 to 44 have an overlap with adjacent sample image regions that is selected to be at least as large as the size of an expected defect. This ensures that a real defect is actually visible in at least one of the sample image regions 40 to 44. If defects are counted, care should be taken that actually identical defects located in two sample image regions are not counted twice.

In the example illustrated in FIGS. 3 and 4A-4B, a distortion of the sample image 20 is small, and, for the associated shift $|\vec{\Delta}(\vec{r})|$:

$$|\vec{\Delta}(\vec{r})|/\min(w_x, w_y) \ll 1 \tag{1}$$

In this case, r denotes a position in the field of view $w_x \times w_y$ and $\vec{\Delta}$ denotes the associated shift. If this equation is satisfied, the structures 23*a* to 32*a* in the sample image 20 are still situated in the vicinity of their expected positions. In this case, an initial registration of the individual sample image regions 40 to 44 or of all the sample image regions with respect to the assigned reference image regions will succeed. By way of example, a field of view (FOV) of an individual beam scanning electron microscope with 10 μm shall be considered. A rotation of the structures located therein by 1 mrad shifts the structures located therein from their expected position (expect position in the reference image) by no more than 10 nm.

In the example illustrated in FIGS. 3 and 4A-4B, the structures 23*a* to 32*a* of the dimension CD, which are to be examined with respect to defects, in the sample image 20 are small and the following applies:

$$\sqrt{(\partial_x \Delta_x)^2 + (\partial_x \Delta_y)^2} \ll 1 \tag{2a}$$

inside a window with the dimension $CD_x$ and $$\sqrt{(\partial_y \Delta_x)^2 + (\partial_y \Delta_y)^2} \ll 1 \tag{2b}$$

inside a window with the dimension $CD_y$

As a result, the conditions (2a), (2b) mean that the distortion does not vary greatly from location to location. A structure 23*a* to 32*a* thus practically does not change its shape due to the distortion (a bar does not become a serpentine and vice versa). The two conditions (1) and (2a) or (2b) mentioned above are normally satisfied anyway in existing semiconductor defect detection methods. For example, let a structure have a spatial extent of 15 nm and experience a rotation by 1 mrad due to a distortion. The structure then experiences a local distortion, which is no greater than 0.05 nm, which in turn lies below the typical resolution limit of a particle beam inspection system. Typical shifts that can occur for structures lie in the order of magnitude of approximately 10 nm. Changes in the shape of the structures that frequently occur lie in a range of less than 1 nm, for example are approximately 0.1 nm, which lies below the resolution limit of a typical particle beam inspection system.

In addition, in FIGS. 3 and 4A-4B, the two inequalities (3) and (4) regarding the edge length $A_{PB}$ of the sample image regions 40 to 44 are satisfied—as discussed above in the general part of the patent application:

$$A_{PB} \geq 5 \max_{\vec{r} \in Bild\_PB} |\vec{\Delta}(\vec{r})| \tag{3}$$

$$A_{PB} \leq A_{Def} * \left(\frac{1}{|grad|\vec{\Delta}||}\right) \tag{4}$$

In accordance with equation (3), the size or dimension of a sample image region 40 to 44 is thus at least five times the size of a maximally occurring distortion. In the example shown, this applies to each direction in which the lateral offset is corrected, so in the example shown both in the x-direction and in the y-direction. In accordance with equation (4), a location-dependent distortion does not change more significantly over each sample image region 40 to 44 than approximately half the defect size $A_{Def}$ which is sought as part of the defect detection.

Figure 5:
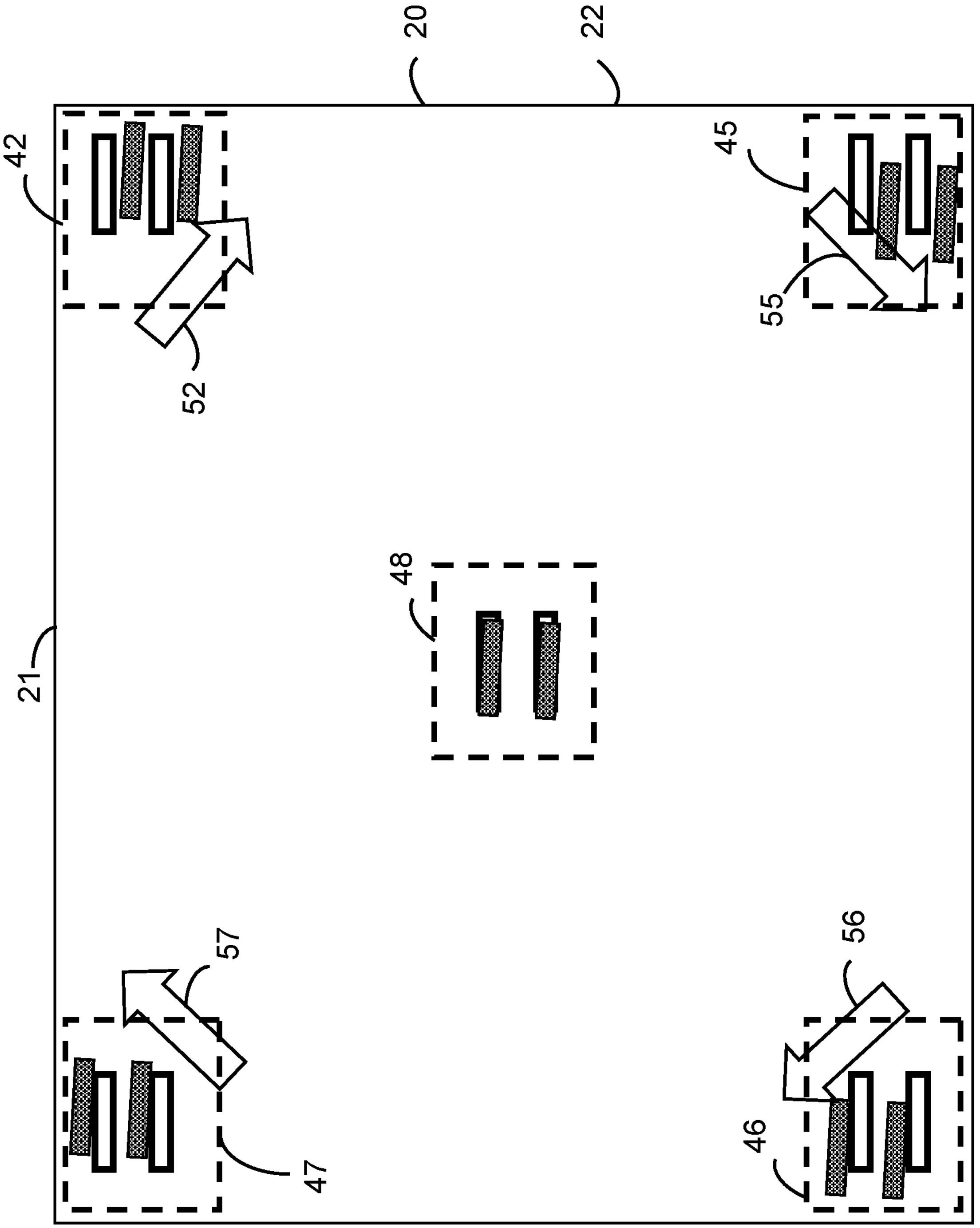
FIG. 5: schematically shows the determination of a distortion pattern in the form of a rotation.

FIG. 5 schematically shows the determination of a distortion pattern in the form of a rotation. Here, reference is once again made to the example illustrated in FIG. 2, the structures illustrated in FIG. 5 are identical to those in FIG. 2. Upon consideration of the sample image regions 42, 45, 46, 47 and 48, it is possible to draw conclusions relating to a distortion function or a distortion pattern for the sample image 20 based on the shifts Δx, Δy which are found per sample image region. The example shown is a rotation, which is indicated by corresponding arrows 52, 55, 56 and 57. The structures of the sample image regions 52, 55, 56 and 57 are rotated overall with respect to the sample image midpoint, or the one approximately centrally arranged sample image region 48. This rotation leads to different corrections of the lateral offset or to shifts in two dimensions Δx, Δy in the different sample image regions 42, 45, 46 and 47. If a distortion function or a distortion pattern is known, it is possible based thereon to adjust and/or calibrate the particle beam inspection system. In future recordings, the sample images (and hence the sample image regions) then may have a smaller distortion or no distortion at all; this depends of course also on the type of the distortion found.

Figure 6B:
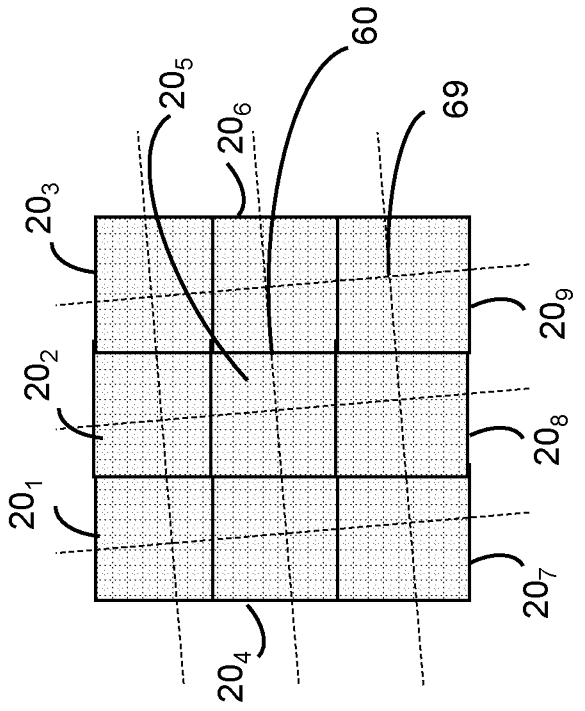
FIGS. 6A-6B: schematically show effects of rotations on a plurality of sample images.
Figure 6A:
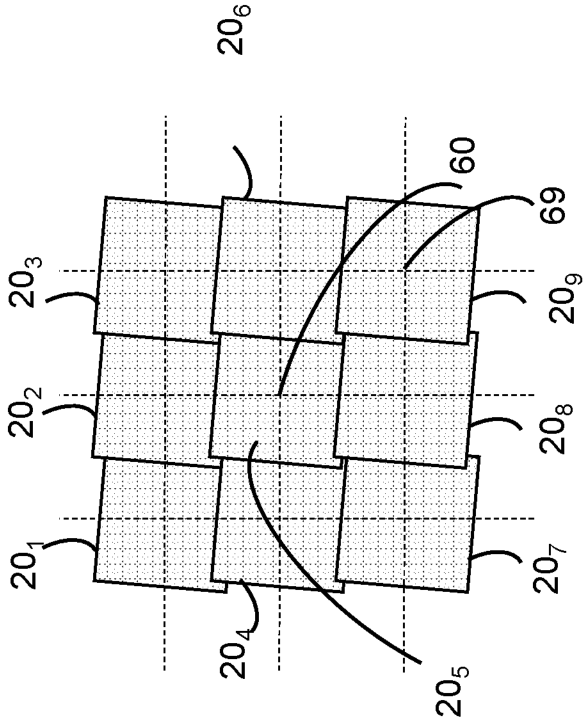

FIG. 6 schematically illustrates effects of rotations on a plurality of sample images $\mathbf{20}_1$ to $\mathbf{20}_9$. The plurality of sample images $\mathbf{20}_1$ to $\mathbf{20}_9$ corresponds to a multi-field of view (mFOV), which can be obtained for example using a multi-beam electron microscope. In multiple particle beam systems, distortions that occur differ depending on the construction type of the inspection system: If the system is one having a plurality of columns, in which an individual electron beam or particle beam is guided through an optical unit that is specifically assigned to the beam, for example the pattern shown in FIG. 6A or the distortion shown in FIG. 6A is obtained: The midpoints of the sample images $\mathbf{20}_i$ correspond to the midpoints of the reference images. Illustrated by way of example are the midpoints 60 and 69 of the sample images $\mathbf{20}_5$ and $\mathbf{20}_9$. FIGS. 6A-6B likewise illustrate the coordinate system of the reference image or of the reference images by way of dashed lines. Although the midpoints lie one on top of the other, or are correctly arranged, a distortion exists nevertheless. The individual sample images 20; are rotated with respect to the reference images in each case by approximately the same absolute value. In a pixel-based defect detection, a plurality of false-positive defects would—without the use of the method according to the disclosure—be detected during the registration of the entire multi-field of view or also during the registration of each sample image 20; in one step, that is to say as a whole. However, this can be prevented by carrying out, according to the disclosure, registration of each sample image 20; in each case for the sample image regions, as already described above.

FIG. 6B shows an example of a different distortion, with the distortion being a rotation in this case, too. Unlike in FIG. 6A, in which the rotation is caused by a field rotation in each particle optical unit of a column of the particle beam system, the distortion shown in FIG. 6B can arise in two ways: First, it is possible that the sample to be examined (semiconductor sample) has been arranged only with limited precision on the sample holder and that a rotation has occurred in the process. However, it is also possible that the multiple particle beam inspection system according to FIG. 6B is a multi-beam system having an individual column, wherein all individual particle beams 3 pass through a common particle optical unit. In the process, all the individual particle beams 3 possibly undergo an image field rotation as they pass through a magnetic field of a magnetic lens, for example as they pass through a common objective lens 102. In this case, the multi-field of view (mFOV) composed of the sample images $\mathbf{20}_1$ to $\mathbf{20}_9$ as a whole is shifted or rotated with respect to the centre 60. This can be seen for example upon consideration of the sample image $\mathbf{20}_9$: Here, the centre of the sample image $\mathbf{20}_9$ is no longer identical to the zero point of the coordinate system 69 of the reference image. If in the distortion situation illustrated in FIG. 6B a registration of the individual sample images 20; is carried out for each sample image 20; completely, that is to say without any division into sample image regions, it becomes immediately clear that in a subsequent pixel-based comparison of the sample images 20; with associated reference images numerous false-positive defects would be detected. The number of false-positive defects increases as the distance from the rotation centre 60 increases. Registration of the individual sample image regions per sample image 20; here provides—as already described above—important improvements. However, it is nevertheless possible that in multi-beam systems a merely sample-image-region-wise registration for each sample image 20; without further measures for a registration and subsequent pixel-based defect detection is not yet sufficient. For such an event, the disclosure proposes to register the plurality of sample images 20; not only in a sample-image-region-wise manner, but in a shell-wise manner with respect to the sample images.

Figure 7B:
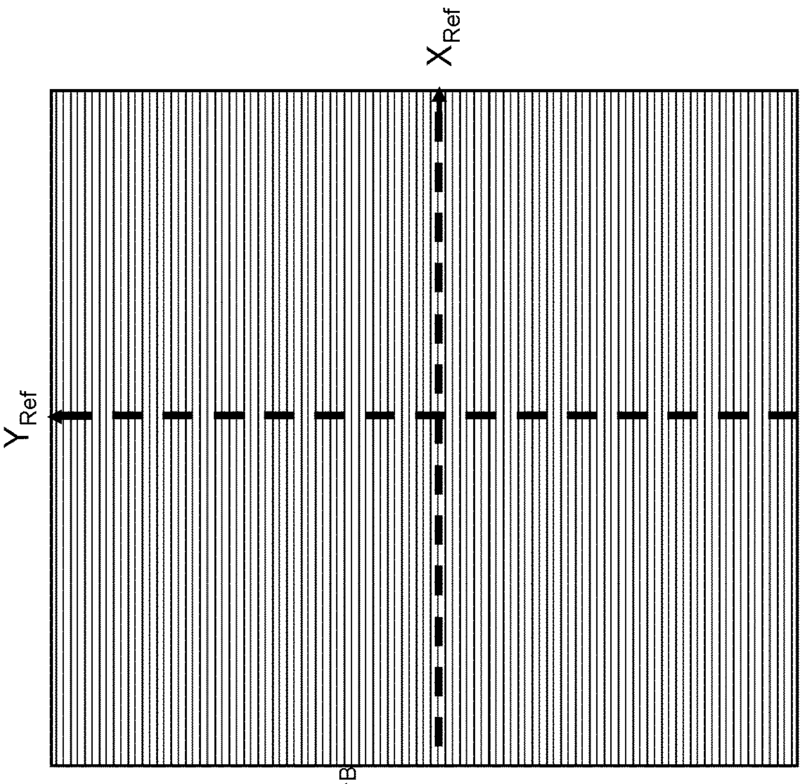
FIGS. 7A-7B: schematically show distortion effects superposed on each other in sample images.
Figure 7A:
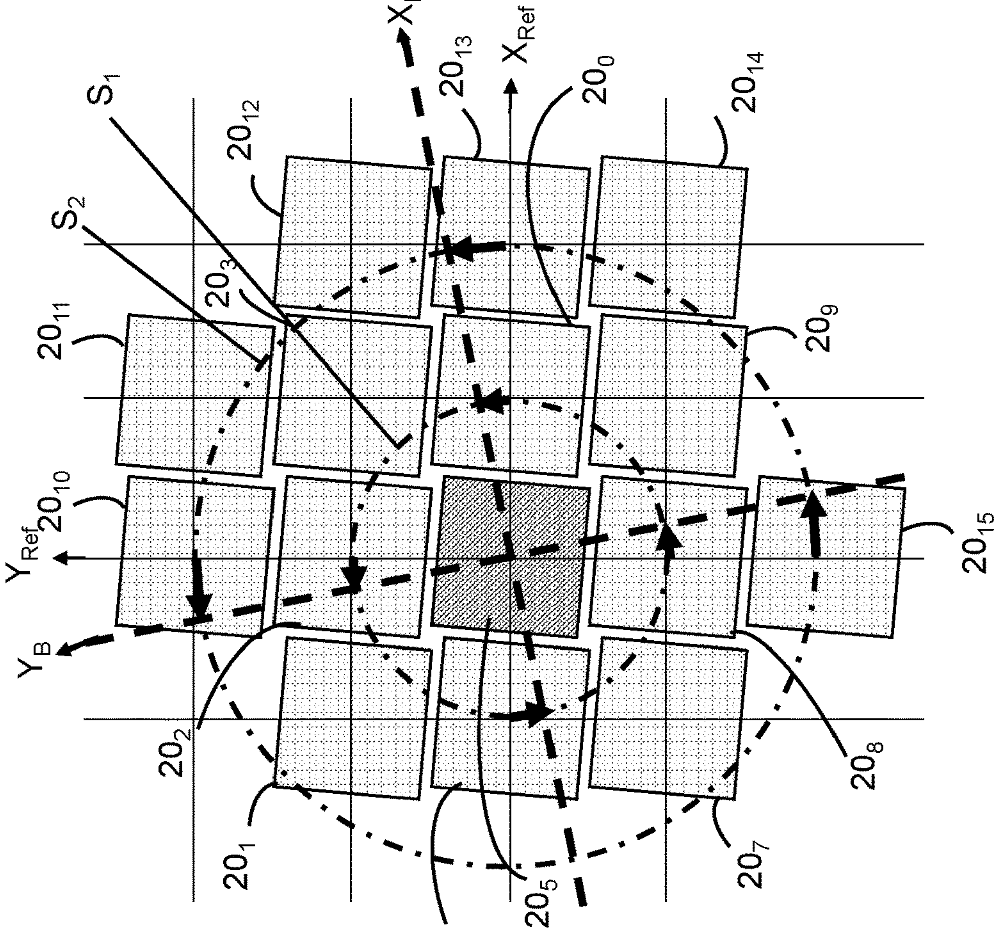

FIG. 7A shows by way of example a shell-wise defect detection comprising a registration of a plurality of sample images $\mathbf{20}_i$, wherein the plurality of sample images 20; have a distortion in the form of a rotation with respect to the reference image. FIG. 7A shows the general case in which different distortions are superposed on top of each another (overlay of the distortions illustrated in FIGS. 6A and 6B). FIG. 7B shows on the right the reference coordinate system having the reference axes $X_{Ref}$ and $Y_{Ref}$.

For the method for defect detection according to the disclosure, first a sample image is selected as a base sample image: the base sample image is denoted in the example shown by the reference sign $\mathbf{20}_5$. It is selected such that structures (not illustrated) that are located with great certainty in the sample image $\mathbf{20}_5$ can be reliably assigned to the corresponding structures in the reference image. Next, a defect detection of the base sample image $\mathbf{20}_5$ is carried out in the manner described, wherein the associated sample image regions are registered in a sample-image-region-wise manner in the sample image $\mathbf{20}_5$. Next, a selection of first sample images that are arranged in a first shell $S_1$ around the base sample image $\mathbf{20}_5$ is carried out: In the example shown, these are the sample images $\mathbf{20}_1$ to $\mathbf{20}_4$ and $\mathbf{20}_6$ to $\mathbf{20}_9$. Due to their spatial proximity to the base sample image $\mathbf{20}_5$ defect detection and registration in a sample-image-region-wise manner also succeeds quite well for the sample images of the first shell $S_1$. After the registration and defect detection, a first angle of rotation for the distortion is determined: the angle of rotation is indicated in the dash-dotted circle $S_1$ by way of the small black arrows. In a further method step, second sample images arranged in a second shell $S_2$ around the base sample image 20$_5$ are then selected; in the example illustrated, only some sample images of the second shell are illustrated, specifically the sample images 20$_{10}$ to 20$_{15}$. Before the start of the defect detection comprising the registration of the sample images 20$_{10}$ to 20$_{15}$, or more generally of the registration of the sample images in the second shell $S_2$, their positions are corrected based on the determined first angle of rotation. In this way, central regions of the sample images 20$_{10}$ to 20$_{15}$ can be prevented from moving ever farther with respect to the reference system, until finally no more assignment between sample images and reference images would be possible at all. After the correction of the rotation, the second individual sample images 20$_{10}$ to 20$_{15}$ are then registered in the manner already described and the method for defect detection is carried out for the second individual sample images 20$_{10}$ to 20$_{15}$, that is to say in a sample-image-region-wise manner. In a further method step, an angle of rotation can be determined again and the method can be carried out as a whole for sample images of a further shell or for sample images of further shells. The more sample images are used for determining the angle of rotation, the more accurately it can be determined, and the better will be the distortion correction as a whole. Consequently, a better defect detection becomes possible in a pixel-based comparison following the registration steps.

The method for defect detection in a sample, in particular in a semiconductor sample, according to the disclosure enables a significant reduction or prevention of false-positive defect detections by way of the sample-image-region-wise registration. This is true both for sample images recorded via individual beam particle beam inspection systems and also for sample images recorded via multiple particle beam inspection systems. In the latter case, shell-wise sample image region-wise registration of the plurality of sample images before the pixel-based comparison of all the corrected sample image regions with the respectively assigned reference image regions for defect detection can even further improve the method.

Example 1. Method for defect detection in a sample, in particular in a semiconductor sample, including the following steps: providing a reference image of the sample;

- providing a sample image generated via a particle beam inspection system, wherein the sample image may have distortions; dividing the sample image into sample image regions; dividing the reference image into reference image regions, wherein each sample image region is assigned one reference image region to form an image region pair;
- identifying in each image region pair a structure that is present both in the sample image region and also in the assigned reference image region of the image region pair;
- registering the sample image regions by correcting a lateral offset of the identified structure in each sample image region on the basis of the location of the identified structure in the respectively assigned reference image region, as a result of which corrected sample image regions are formed; and comparing each corrected sample image region pixel by pixel with the respectively associated reference image region for defect detection.

Example 2. Method according to example 1, furthermore including the following steps:

- providing an expected defect size $A_{Def}$, and
- defining an edge length $A_{PB}$ of the sample image region such that the edge length $A_{PB}$ is at least five times the size of a distortion $\vec{\Delta}(\vec{r})$ maximally occurring in the sample image region, thus $$A_{PB} \geq 5 \max_{\vec{r} \in Bild\_PB} |\vec{\Delta}(\vec{r})|$$

Example 3. Method according to either of the preceding examples, furthermore including the following steps:

- providing an expected defect size $A_{Def}$, and
- defining an edge length $A_{PB}$ of the sample image region such that the location-dependent distortion $\vec{\Delta}(\vec{x})$, does not change more significantly over a sample image region than half the expected defect size $A_{Def}$, thus $$A_{PB} \leq A_{Def} * \left( \frac{1}{|grad|\vec{\Delta}||} \right),$$

wherein $|grad|\vec{\Delta}||$ denotes the absolute value of the gradient of the location-dependent distortion $\vec{\Delta}(\vec{x})$.

Example 4. Method according to any of the preceding examples,

- wherein the respective lateral offset of the respectively identified structure is corrected in two directions which are linearly independent with respect to one another, in particular in two mutually orthogonal directions.

Example 5. Method according to any one of the preceding examples,

- wherein a size of the sample image regions is selected, when dividing the sample image, such that a shape of the sample image regions does not substantially change due to the distortion.

Example 6. Method according to the preceding example,

- wherein the sample image regions are quadrangular, in particular rectangular or square, and
- wherein the distances between the corners of the sample image regions are shifted relative to one another with respect to the associated distances between the corners of the reference image regions relative to one another due to the distortion by no more than a predetermined number of pixels.

Example 7. Method according to the preceding example,

- wherein the distances between the corners of the sample image regions are shifted relative to one another with respect to the associated distances between the corners of the reference image regions relative to one another due to the distortion by no more than half an expected defect size.

Example 8. Method according to any of the preceding examples,

- wherein mutually adjacent sample image regions have an overlap, and
- wherein the respective overlap is selected to be at least as large as the size of an expected defect.

Example 9. Method according to any of the preceding examples, wherein the sample image has, with respect to the reference image, an affine distortion; and/or wherein the sample image has, with respect to the reference image, a non-linear distortion.

Example 10. Method according to any of the preceding examples, wherein the sample image comprises, with respect to the reference image, a rotation.

Example 11. The method according to any one of the preceding examples, furthermore including the following step:

determining a distortion function or a distortion pattern for the sample image on the basis of the corrected lateral offset of the sample image regions during registration.

Example 12. Method according to the preceding example, furthermore including the following step:

adjusting and/or calibrating the particle beam inspection system on the basis of the distortion function and/or the distortion pattern.

Example 13. The method according to any one of the preceding examples, furthermore including the following step:

coarsely registering the sample image with respect to the reference image.

Example 14. Method according to any of the preceding examples, wherein the particle beam inspection system is an individual particle beam system, in particular an individual beam electron microscope (SEM) or a helium ion microscope (HIM).

Example 15. Method according to one of examples 1 to 13, wherein the particle beam inspection system is a multiple particle beam system, in particular a multi-beam electron microscope (MSEM) operating with a plurality of individual particle beams.

Example 16. Method according to the preceding example, wherein the method is carried out for a plurality of sample images, and wherein each sample image is generated via an individual particle beam assigned thereto.

Example 17. Method according to the preceding example, wherein the plurality of sample images are registered in a shell-wise manner.

Example 18. Method according to the preceding example, wherein the sample images are arranged hexagonally with respect to one another; and/or wherein the sample images have an overlap with adjacent sample images.

Example 19. Method according to the preceding example, furthermore including the following steps:

selecting a sample image as base sample image;

registering the base sample image;

selecting first sample images that are arranged in a first shell around the base sample image; and registering the first sample images.

Example 20. Method according to the preceding example, furthermore including the following step:

determining a first angle of rotation for the distortion based on the registration of the first sample images of the first shell.

Example 21. Method according to the preceding example, furthermore including the following steps:

selecting second sample images that are arranged in a second shell around the base sample image; and registering the second sample images on the basis of the determined first angle of rotation.

Example 22. Method according to the preceding example, furthermore including the following step:

determining a second angle of rotation for the distortion based on the registration of the second sample images of the second shell.

Example 23. Method according to the preceding example, furthermore including the following steps:

selecting third sample images that are arranged in a third shell around the base sample image; and registering the third individual sample images on the basis of the determined second angle of rotation.

Example 24. Method according to the preceding example, wherein the method is carried out for a further shell or for further shells.

Example 25. Computer program product comprising a program code for carrying out the method according to any of the preceding examples 1 to 24.

LIST OF REFERENCE SIGNS

1 Multi-beam particle microscope
3 Primary particle beams (individual particle beams)
5 Beam spots, incidence locations
7 Object
8 Sample stage
9 Secondary particle beams
10 Computer system, controller
11 Secondary particle beam path
13 Primary particle beam path
20 Sample image
21 Side of the sample image
22 Side of the sample image
23 Structure
24 Structure
25 Structure
26 Structure
27 Structure
28 Structure
29 Structure
30 Structure
31 Structure
32 Structure
40 Sample image region (patch)
41 Sample image region (patch)
42 Sample image region (patch)
43 Sample image region (patch)
44 Sample image region (patch)
45 Sample image region (patch)
46 Sample image region (patch)
47 Sample image region (patch)
48 Sample image region (patch)
52 Arrow for marking the distortion (rotation)
55 Arrow for marking the distortion (rotation)
56 Arrow for marking the distortion (rotation)
57 Arrow for marking the distortion (rotation)
60 Coordinate origin, centre of the sample image region $\mathbf{20}_5$ (base sample image region)
69 Centre of the sample image region $\mathbf{20}_9$
100 Objective lens system
101 Object plane
102 Objective lens
103 Field
110 Aperture
200 Detector system
205 Projection lens 207 Detection region
209 Particle multi-detector
211 Detection plane
213 Incidence locations
215 Detection region
217 Field
300 Beam generating apparatus
301 Particle source
303 Collimation lens system
305 Multi-aperture arrangement
306 Micro-optics
307 Field lens system
309 Diverging particle beam
311 Illuminating particle beam
313 Multi-aperture plate
315 Openings in the multi-aperture plate
317 Midpoints of the openings
319 Field
323 Beam foci
325 Intermediate image plane
400 Beam switch
$X_{Ref}$ x-axis of the reference image
$y_{Ref}$ y-axis of the reference image
Δx Lateral offset in the x-direction
Δy Lateral offset in the y-direction
S1 First shell
S2 Second shell
$A_{PBx}$ Edge length of a sample image region in the x-direction
$A_{PBy}$ Edge length of a sample image region in the y-direction

What is claimed is:

1. A method of performing a pixel-based defect detection of a sample, the method comprising:

a) providing a reference image of the sample;

b) providing a sample image-which comprising a rotational error such that the sample image is rotated relative to the reference image, the sample image having been generated using a particle beam inspection system;

c) dividing the sample image into sample image regions;

d) dividing the reference image into reference image regions, each sample image region comprising a rotational error, each sample image region being assigned a reference image region to form an image region pair;

e) for each image region pair, identifying a structure that is present both in the sample image region and the reference image region;

f) without performing a mathematical rotation of the sample image regions, registering the sample image regions by correcting a lateral offset of the identified structure in each sample image region based on the location of the identified structure in the respectively assigned reference image region, thereby forming corrected sample image regions; and g) comparing each corrected sample image region pixel by pixel with the respectively associated reference image region to perform the pixel-based defect detection of the sample.

2. The method according to claim 1, wherein, for each of at least some of the sample image regions, an edge length of the sample image region is at least five times a size of a maximum distortion in the sample image region.

3. The method of claim 1, further comprising:

providing an expected defect size $A_{Def}$, and defining an edge length $A_{PB}$ of the sample image region such that a location-dependent distortion $\vec{\Delta}(\vec{x})$, does not change more significantly over a sample image region than half the expected defect size $A_{Def}$, thus $$A_{PB} \leq A_{Def} * \left(\frac{1}{|grad|\vec{\Delta}||}\right),$$

wherein $|grad|\vec{\Delta}|$ is an absolute value of the gradient of the location-dependent distortion $\vec{\Delta}(\vec{x})$.

4. The method of claim 1, wherein a respective lateral offset of the respectively identified structure is corrected in two directions which are linearly independent of each other.

5. The method of claim 1, wherein a size of the sample image regions is selected, when dividing the sample image, such that a shape of the sample image regions does not substantially change due to the distortion.

6. The method of claim 5, wherein:

the sample image regions are quadrangular; and distances between corners of the sample image regions are shifted relative to one another with respect to associated distances between the corners of the reference image regions relative to one another due to the distortion by no more than a predetermined number of pixels.

7. The method of claim 6, wherein the distances between the corners of the sample image regions are shifted relative to one another with respect to the associated distances between the corners of the reference image regions relative to one another due to the distortion by no more than half an expected defect size.

8. The method of claim 1, wherein mutually adjacent sample image regions have an overlap, and the overlap is as large as a size of an expected defect.

9. The method of claim 1, wherein the sample image has, with respect to the reference image:

an affine distortion in addition to the rotation; and/or a non-linear distortion.

10. The method of claim 1, further comprising determining a distortion function or a distortion pattern for the sample image based on the corrected lateral offset of the sample image regions during registration.

11. The method of claim 1, further comprising determining a rotation angle of the sample image with respect to the reference image.

12. The method of claim 10, further comprising adjusting and/or calibrating the particle beam inspection system based on the distortion function and/or the distortion pattern.

13. The method of claim 1, further comprising coarsely registering the sample image with respect to the reference image.

14. The method of claim 1, wherein the particle beam inspection system comprises an individual particle beam system.

15. The method of claim 1, wherein the particle beam inspection system comprises a multiple particle beam system.

16. The method of claim 1, comprising performing the method for a plurality of sample images, wherein each sample image is generated using an individual particle beam assigned thereto.

17. The method of claim 16, wherein the multiple particle beam system comprises a single column for the plurality of individual particle beams.

18. The method of claim 16, comprising performing the method for the plurality of sample images in a shell-wise manner.

19. One or more machine-readable hardware storage devices comprising instructions that are executable by one or more processing devices to perform operations comprising the method of claim 1.

20. A system, comprising:

one or more processing devices; and one or more machine-readable hardware storage devices comprising instructions that are executable by one or more processing devices to perform operations comprising the method of claim 1.

21. The method of claim 18, wherein:

the sample images are arranged hexagonally with respect to one another; and/or wherein the sample images have an overlap with adjacent sample images.

22. The method of claim 21, further comprising:

selecting a sample image as base sample image;

performing a) to g) for the base sample image;

selecting first sample images that are arranged in a first shell around the base sample image; and performing a) to g) for the first sample images.

23. The method of claim 22, further comprising determining a first angle of rotation for a distortion based on the sample image region-wise registration of the first sample images of the first shell.

24. The method of claim 23, further comprising:

selecting second sample images that are arranged in a second shell around the base sample image;

correcting a position of the second sample images based on the determined first angle of rotation; and performing a) to g) for the position-corrected second sample images.

25. The method of claim 24, further comprising determining a second angle of rotation for the distortion based on the sample image region-wise registration of the second sample images of the second shell.

26. The method of claim 25, further comprising:

selecting third sample images that are arranged in a third shell around the base sample image;

correcting a position of the third sample images based on the determined second angle of rotation; and performing a) to g) for the position-corrected third individual sample images.

27. The method of claim 26, comprising performing a) to g) for a further shell or for further shells of sample images.

* * * * *